United States Patent
Onodera et al.

(10) Patent No.: US 6,373,140 B1
(45) Date of Patent: Apr. 16, 2002

(54) SEMICONDUCTOR DEVICE

(75) Inventors: Masanori Onodera; Shinsuke Nakajo, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/526,294

(22) Filed: Mar. 15, 2000

(30) Foreign Application Priority Data

Aug. 25, 1999 (JP) .............................. 11-238907

(51) Int. Cl.[7] .................. H01L 23/48; H01L 23/52; H01L 23/28; H01L 29/40
(52) U.S. Cl. .................. 257/780; 257/784; 257/737; 257/738; 257/787; 257/797; 257/730; 257/690
(58) Field of Search ................. 257/784, 785, 257/787–797, 737, 730; 438/112

(56) References Cited

U.S. PATENT DOCUMENTS

| | | | | |
|---|---|---|---|---|
| 5,726,502 A | * | 3/1998 | Beddingfield | 257/797 |
| 6,001,671 A | * | 12/1999 | Fjelstad | 438/112 |
| 6,072,239 A | * | 6/2000 | Yoneda et al. | 257/730 |
| 6,097,082 A | * | 8/2000 | Sato | 257/668 |
| 6,235,996 B1 | * | 5/2001 | Farooq et al. | 174/257 |

* cited by examiner

Primary Examiner—Tom Thomas
Assistant Examiner—Nitin Parekh
(74) Attorney, Agent, or Firm—Armstrong, Westerman & Hattori, LLP

(57) ABSTRACT

A semiconductor device having high-density external connection electrodes is provided. The principal object of the present invention is to ensure accurate detection of the locations of detection marks for positioning the mounting terminals at a time of mounting the semiconductor device to a printed circuit board. The semiconductor device includes a semiconductor chip, a resin package for encapsulating the semiconductor chip, stud bumps formed on the packaging surface of the resin package, and wires which are connected to the semiconductor chip at one end and are connected to the stud bumps at the other end. The semiconductor device further includes detection mark wires which are exposed through the packaging surface of the resin package at one end. The exposed portions of the detection mark wires are used as detection marks.

6 Claims, 24 Drawing Sheets

FIG. 1 PRIOR ART
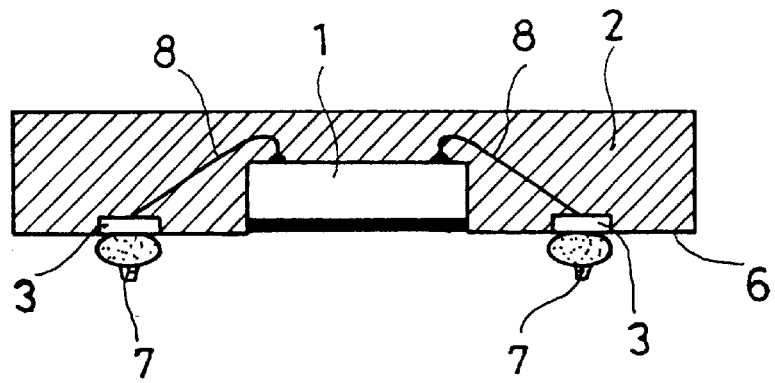
FIG. 2A PRIOR ART
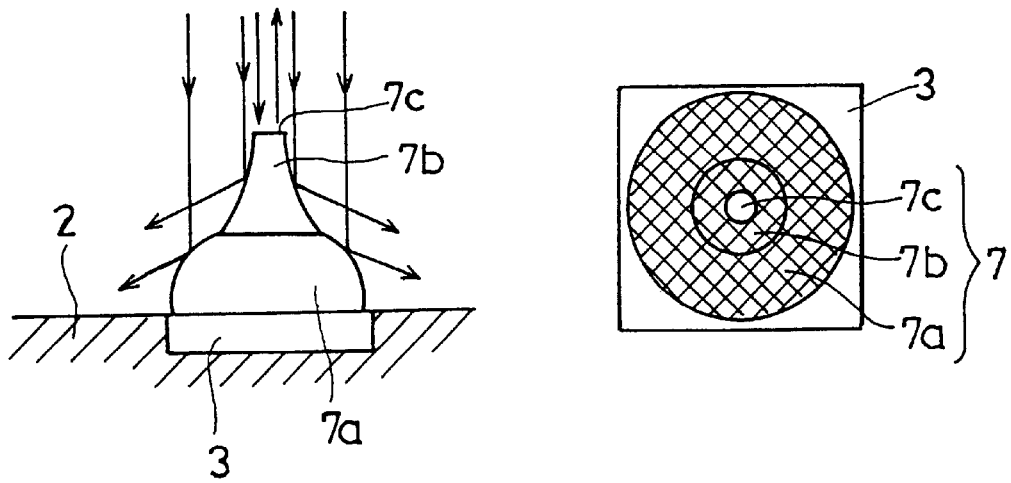
FIG. 2B PRIOR ART

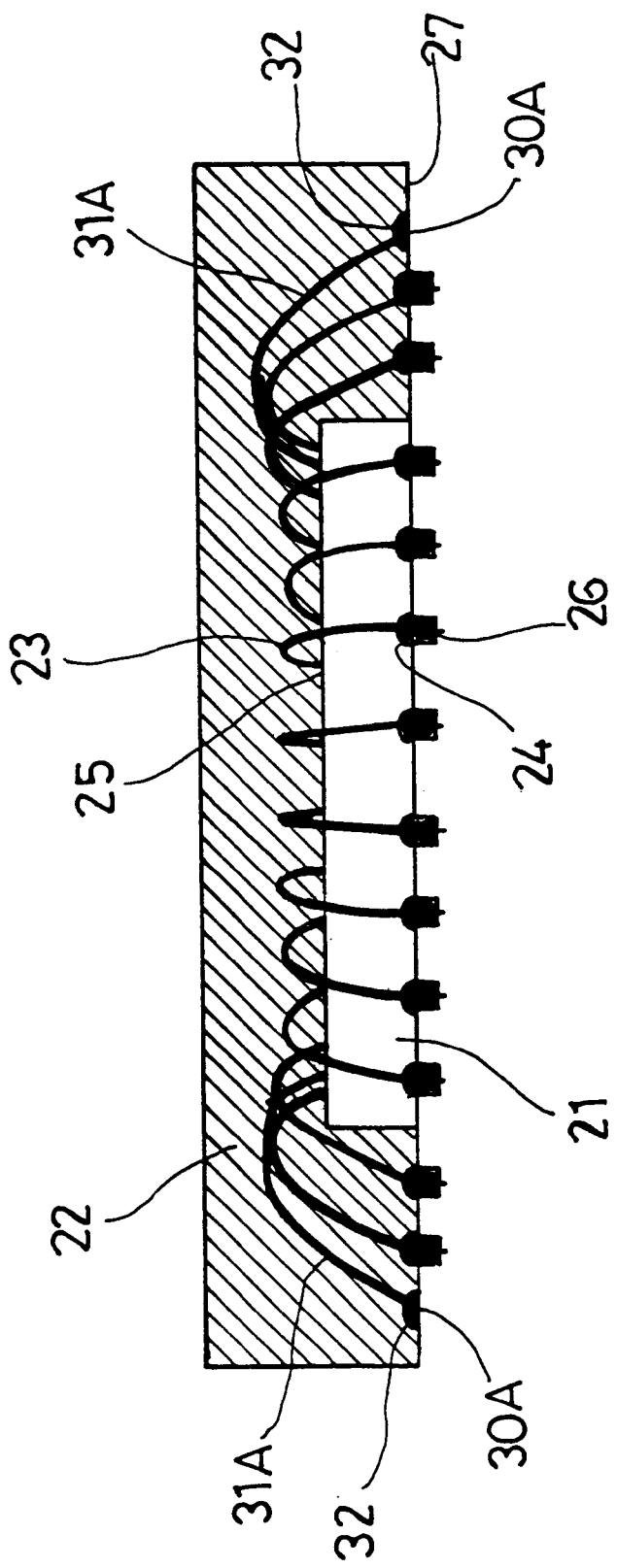

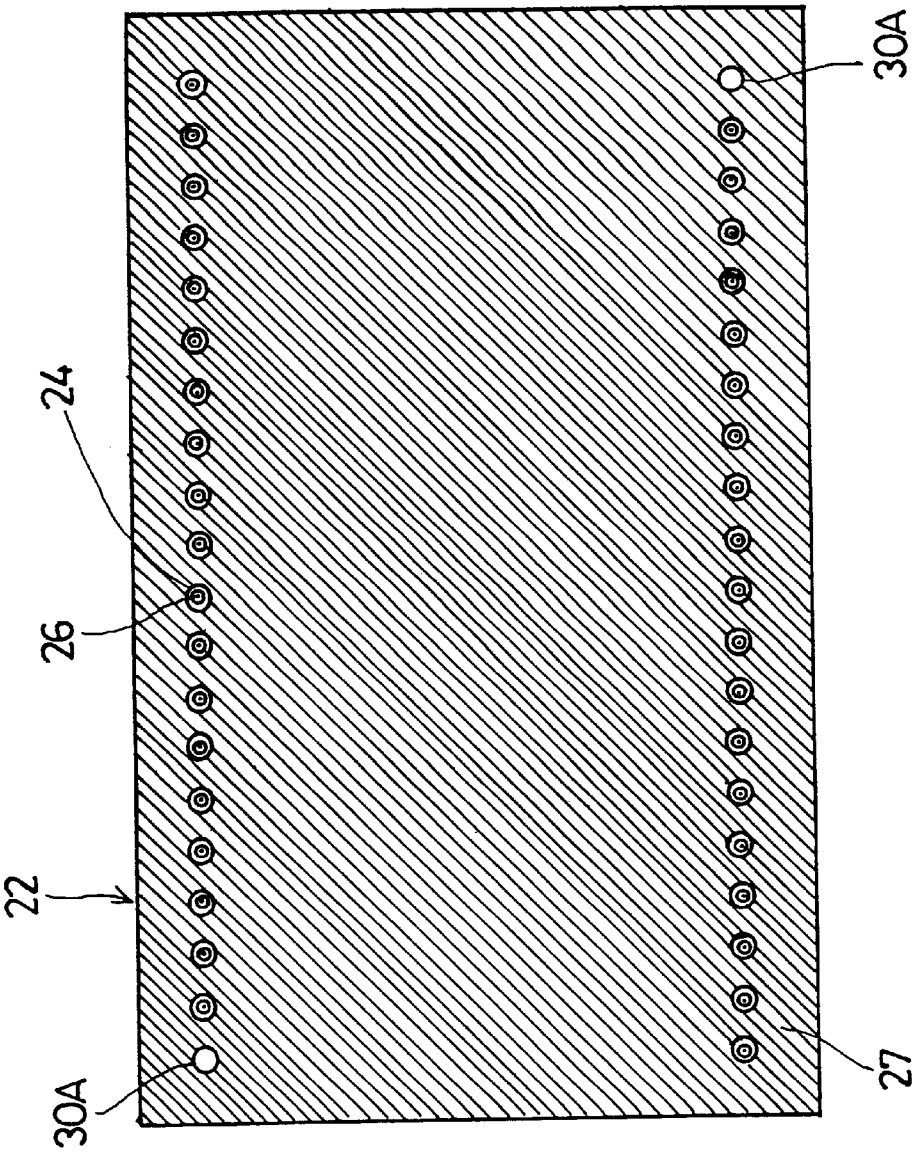

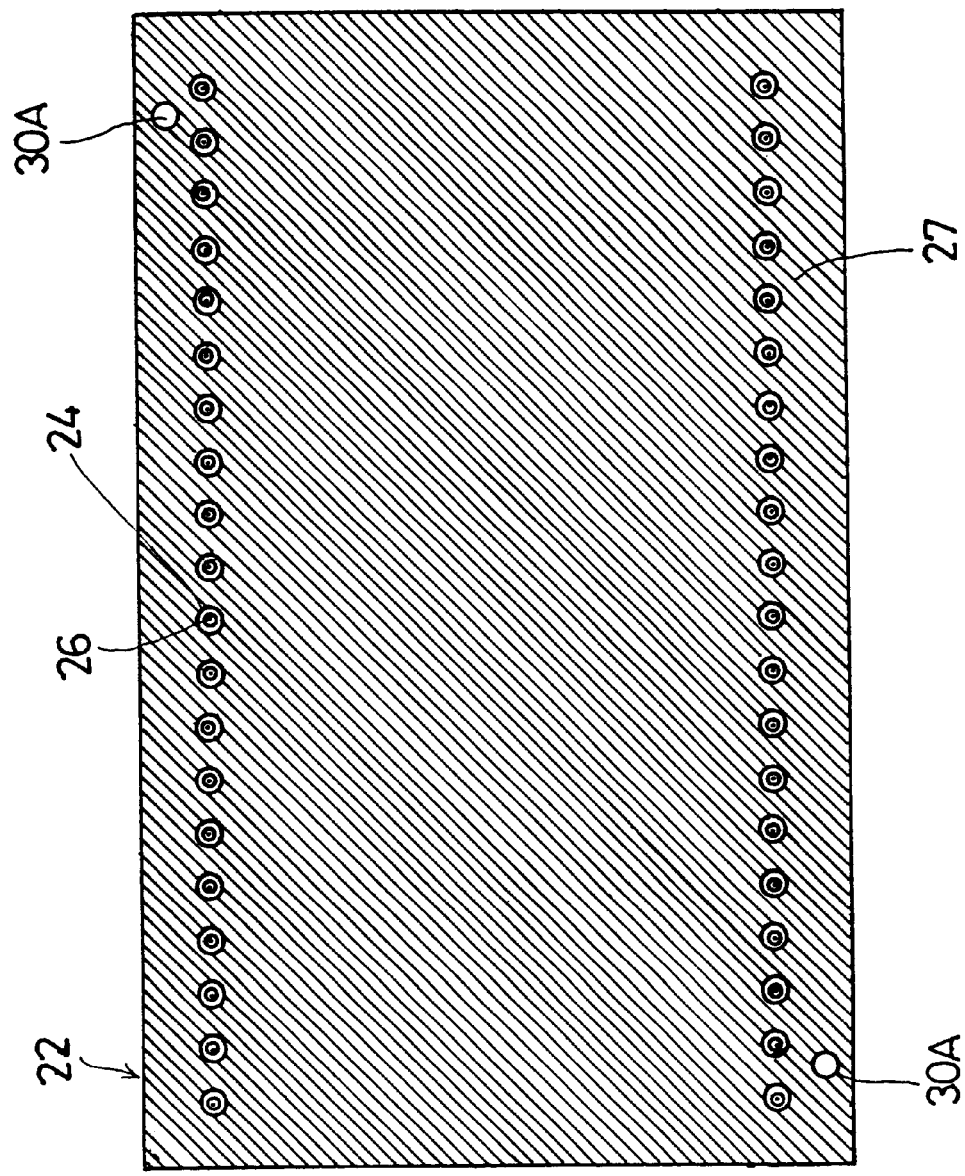

SEMICONDUCTOR DEVICE

BACKGROUND OF THE INVENTION

1. Field of the Invention

The present invention generally relates to semiconductor devices, and, more particularly, to a semiconductor device having high-density external connection electrodes.

In recent years, there has been an increasing demand for semiconductor devices having small packaging surfaces, as electronic apparatuses have been becoming smaller. Semiconductor devices are also expected to have a narrower electrode pitch or external connection terminal pitch.

2. Description of the Related Art

FIG. 1 is a sectional view of a semiconductor device 10 of the prior art.

The semiconductor device 10 has a simple structure comprising a semiconductor chip 1, a resin package 2, metal films 3, and stud bumps 7. The semiconductor chip 1 is connected to the metal films via wires 8. The lower surface of each metal film 3 is arranged on the same plane as the packaging surface 6 of the resin package 2. The resin package 2 covers the semiconductor chip 1, the metal films 3 except the lower surfaces, and the wires 8. The resin package 2 thus protects the semiconductor chip 1, the metal films 3, and the wires 8. A stud bump 7 which serves as a mounting terminal is attached to the bottom surface of each metal film 3.

The stud bumps 7 as the mounting terminals can be arranged at short intervals, and high-density mounting can be achieved accordingly.

When the semiconductor device 10 is mounted on a printed circuit board, the positions of the stud bumps 7 are detected, so that the stud bumps 7 are positioned to connection electrodes formed on the printed circuit board. As shown in FIG. 2A, the stud bumps 7 are irradiated with light, and a CCD camera 9 picks up the reflected light from the stud bumps 7. For ease of explanation, only one stud bump 7 is shown in FIGS. 2A and 2B. The image data picked up by the CCD camera 9 is then processed to detect the positions of the stud bumps 7.

Each of the stud bumps 7 has a bonding portion 7a connected to the corresponding metal film 3, a protruding portion 7b situated on the bonding portion 7a, and a flat top end portion 7c formed at the top end of the protruding portion 7b. The bonding portion 7a and the protruding portion 7b both have a curved exterior. When the stud bumps 7 having the curved exterior are irradiated with light, the light scatters on the curved exterior surfaces of the bonding portions 7a and the protruding portions 7b. As a result, the strength of light received by the CCD camera 9 is reduced.

FIG. 2B shows an image of a stud bump 7 picked up by the CCD camera 9. In this figure, the shaded portion represents where light scattering has occurred. In the case where the stud bumps 7 are used as detection marks for detecting their positions, the picked-up image of each stud bump 7 is too dark to detect, resulting in inaccurate detection of the positions of the stud bumps 7. Such inaccuracy leads to a poor packaging yield of semiconductor devices.

SUMMARY OF THE INVENTION

A general object of the present invention is to provide semiconductor devices in which the above disadvantages are eliminated.

A more specific object of the present invention is to provide a semiconductor device, with which the positions of mounting terminals can be accurately detected at a time of mounting, thereby attaining a high packaging yield.

The above objects of the present invention are achieved by a semiconductor device comprising:

a semiconductor chip;

a resin package which encapsulates the semiconductor chip;

mounting terminals formed on a bottom surface of the resin package facing a printed circuit board, the mounting terminals protruding from the bottom surface;

first wires which are connected to the semiconductor chip at one end and are directly connected to the mounting terminals at the other end; and second wires which are exposed at one end through the resin package so as to form a flat surface with the bottom surface of the resin package.

With the above structure, the exposed portions of the second wires can function as detection marks, and the light reflectance at the detection marks can be made high. Thus, the positions of the detection marks can be accurately detected, and the accuracy in mounting the semiconductor device to a printed circuit board can be improved.

Also, the second wires can be formed at the same time as the wire bonding process of the first wires. Accordingly, the detection marks can be easily formed. Furthermore, the exposed portions of the second wires are used as the detection marks, so that the accuracy in positioning the first wires at the time of mounting the semiconductor device to a printed circuit board can be greatly improved.

The above objects of the present invention are also achieved by a semiconductor device comprising:

a semiconductor chip;

a resin package which encapsulates the semiconductor chip;

mounting terminals formed on a bottom surface of the resin package facing a printed circuit board, the mounting terminals protruding from the bottom surface of the resin package;

wires which are connected to the semiconductor chip at one end, and are connected to the mounting terminals at the other end through first metal films formed on the bottom surface of the resin package; and second metal films which are exposed through the bottom surface of the resin package.

With the above structure, the exposed second metal films function as detection marks, and the light reflectance at the exposed portions can be improved. Thus, the positions of the detection marks can be accurately detected, and the accuracy in mounting the semiconductor device to a printed circuit board can be improved.

It is difficult for some detection devices to detect circular detection marks such as those formed by the second wires. To avoid such difficulties, the detection marks are formed by the second metal films, which can have any shape such as a rectangular shape, a cross-like shape, or a T-like shape. Thus, the positions of the detection marks can be accurately detected by a detection device that has difficulties in detecting circular objects, and the semiconductor device can be accurately mounted in a predetermined position.

The above objects of the present invention are also achieved by a semiconductor device comprising:

a semiconductor chip;

a resin package which encapsulates the semiconductor chip; and protruding electrodes as mounting terminals, wherein the protruding electrodes have flat top end surfaces.

With the above structure, the flat top end surfaces of the protruding electrodes can be used as detection marks. Since the light reflectance at the top ends of the protruding portions is high, the positions of the top ends can be accurately detected. Thus, the accuracy in mounting the semiconductor device to a printed circuit board can be greatly improved.

The above and other objects and features of the present invention will become more apparent from the following description taken in conjunction with the accompanying drawings.

BRIEF DESCRIPTION OF THE DRAWINGS

FIG. 1 is a sectional view of a semiconductor device of the prior art;

FIGS. 2A and 2B illustrate problems in the semiconductor device of the prior art;

FIG. 3 is a sectional view of a semiconductor device of a first embodiment of the present invention;

FIG. 5 is a bottom view of a semiconductor device of a second embodiment of the present invention;

FIG. 6 is a bottom view of a semiconductor device of a third embodiment of the present invention;

DESCRIPTION OF THE PREFERRED EMBODIMENTS

Figure 4A:
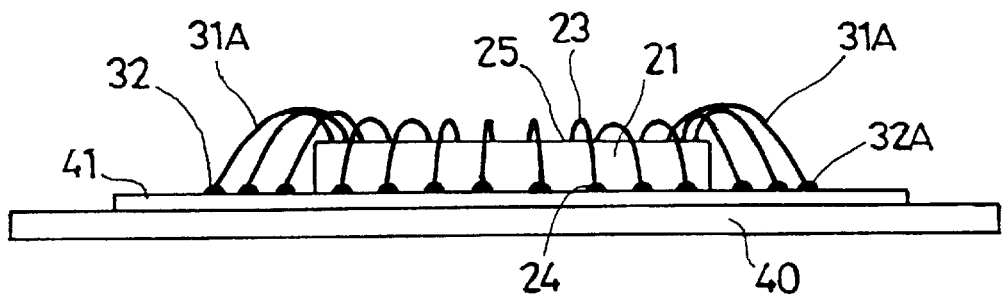
FIGS. 4A to 4D illustrate a method of producing the semiconductor device of the first embodiment of the present invention.

The following is a description of embodiments of the present invention, with reference to the accompanying drawings.

FIG. 3 shows a semiconductor device 20A of a first embodiment of the present invention. The semiconductor device 20A has a simple structure, comprising a semiconductor chip 21, a resin package 22, electrical connecting wires 23, detection mark wires 31A, and stud bumps 26 (protrusion electrodes).

A plurality of electrode pads 28 (see FIG. 7) are on the upper surface of the semiconductor chip 21, which is placed inside the semiconductor device 20A in a face-up fashion. The resin package is formed by molding (or potting) epoxy resin. The resin package 22 encapsulates the semiconductor chip 21, the electrical connecting wires 23, and the detection mark wires 31A, thereby protecting them.

The electrical connecting wires 23 and the detection mark wires 31A have different functions. Each of the electrical connecting wires 23 and the detection mark wires 31A is a metal wire, and is formed by a wire bonding machine. The electrical connecting wires 23 (hereinafter referred to simply as "wire 23") electrically connect the electrode pads 28 on the semiconductor chip 21 to the stud bumps 26 as the mounting terminals. The detection mark wires 31A represent the features of the present invention, and connect the semiconductor chip 21 to detection marks 30A.

In this embodiment, the wires 23 and the detection mark wires 31A both extend from the packaging surface 27 of the resin package 22 to the upper surface of the semiconductor chip 21. The packaging surface 27 of the resin package 22 serves as a first bonding side of the wires 23 and the detection mark wires 31A, and the upper surface of the semiconductor chip 21 is a second bonding side.

The first bonding end portions 24 of the wires 23 and the first bonding end portions 32 of the detection mark wires 31A are arranged on the same plane as the packaging surface 27, so as to form the flat bottom surface of the semiconductor device 20A. The second bonding end portions 25 of the wires 23 and the second bonding end portions 33 of the detection mark wires 31A are both connected to prescribed pads formed on the semiconductor chip 21.

The stud bumps 26 as the mounting terminals are formed on the first bonding end portions 24 of the wires 23. On the other hand, no stud bumps are formed on the first bonding end portions 32 of the detection mark wires 31A. As a result, the first bonding end portions 32 of the detection mark wires 31A are exposed through the packaging surface 27 of the resin package 22.

In this embodiment, the first bonding end portions 32 exposed through the packaging surface 27 are used as the detection marks 30A. The detection marks 30A are situated on the same plane as the packaging surface 27, so as to form the flat bottom surface of the semiconductor device 20A. Also, since the detection marks 30A form a part of the detection mark wires 31A that are metal wires, the detection marks 30A exposed through the packaging surface 27 have metallic luster. Accordingly, the detection marks 30A have flat, metallic surfaces, and the light reflectance is high at the detection marks 30A. When a position detecting process is carried out for the semiconductor device 20A, less light will scatter at the detection marks 30A, and a larger amount of light will be received by a CCD camera. Thus, the detection marks 30A can be accurately detected, and the reliability in the mounting of the semiconductor device 20A on a printed circuit board (not shown) can be improved.

Meanwhile, the wires 23 and the detection mark wires 31A are formed by the use of a wire bonding machine. The positions of the wires 23 and the detection mark wires 31A are stored in a memory unit in the wire bonding machine. Based on the position data stored in the memory unit, the wire bonding machine performs the wire bonding on the wires 23 and the detection mark wires 31A. Accordingly, the positional relationships among the wire 23 and the detection mark wires 31A are predetermined. Even if the exterior shape of the resin package 22 varies, the wires 23 and the detection mark wires 31A maintain the predetermined positional relationships.

Since the positional relationships among the wires 23 and the detection mark wires 31A are invariable, the detection marks 30A that are the exposed portions of the detection mark wires 31A can be readily detected, thereby ensuring accurate positioning of the wires 23. As the wire positioning accuracy is improved, the stud bumps 26 (mounting terminals) attached to the wires 23 can be accurately positioned, and improper mounting can be prevented. Also, since the wires 23 and the detection mark wires 31A are formed at the same time, it is not necessary to employ the step of forming the detection marks 30A.

Referring now to FIGS. 4A to 4D, a method of producing the semiconductor device 20A having the detection marks 30A will be described.

First, as shown in FIG. 4A, a lead frame 40 having a metal plating film 41 formed thereon is prepared, and the semiconductor chip 21 is placed on the metal plating film 41 on the lead frame 40 with adhesive (not shown). The lead frame 40 is then set in a wire bonding machine to form the wires 23 and the detection mark wires 31A.

Upon formation of the wires 23 and the detection mark wires 31A, the first bonding is performed on the metal plating film 41 to form the first bonding end portions 24 and 32. The wires 23 and the detection mark wires 31A are bonded to the metal plating film 41. The material of the metal plating film 41 should have high bonding ability with respect to the wires and the detection mark wires 31A.

After the formation of the first bonding end portions 24 and 32, the wires 23 and the detection mark wires 31A are pulled toward the upper surface of the semiconductor chip 21. The second bonding is then performed on the electrode pads on the semiconductor chip 21 to form the second bonding end portions 25 and 33. Thus, the wires 23 and the detection mark wires 31A are bonded to the semiconductor chip 21. This bonding technique is called reverse bonding, by which the wire loop can be made lower. In FIG. 4A, the wires 23 and the detection mark wires 31A are already formed. The process explained so far constitutes a chip mounting step.

Figure 4B:
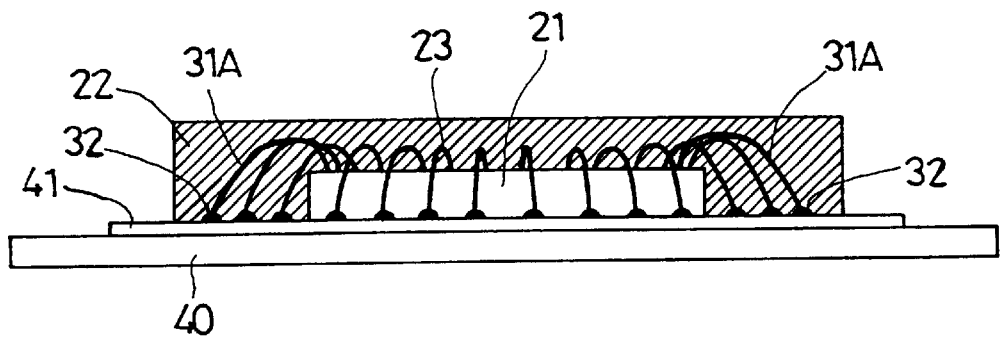

After the chip mounting step, an encapsulation step is carried out to form the resin package 22 for encapsulating the semiconductor chip 21, the wires 23, and the detection mark wires 31A. In this embodiment, the resin package 22 is formed by molding a resin material, but it is possible to form the resin package 22 by potting. FIG. 4B shows the resin package 22 already formed through the encapsulation step.

Figure 4C:
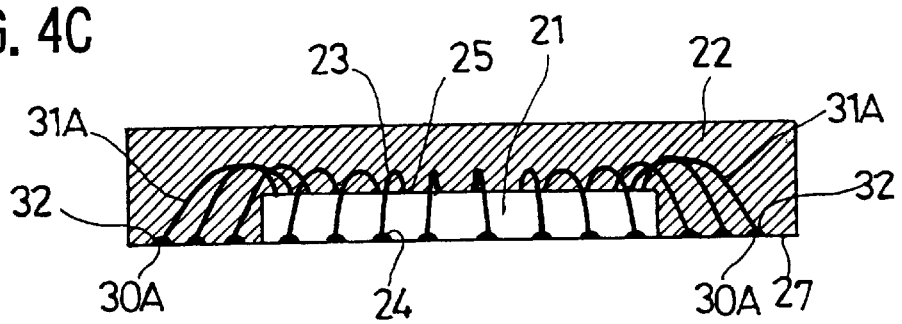

After the encapsulation step, a melting step is carried out to remove the resin package 22 from the lead frame 40 and the metal plating film 41. In this melting step, etching liquid is sprayed on the lead frame 40, so that the lead frame 40 and the metal plating film 41 are melted, and that the resin package 22 is freed from the lead frame 40 and the metal plating film 41. The etching liquid used in this melting step melts the lead frame 40 and the metal plating film 41, but does not melt the wires 23 and the detection mark wires 31A. After the melting step, the bottom surfaces of the first bonding end portions 24 and 32 are exposed through the packaging surface 27 of the resin package 22, as shown in FIG. 4C. The exposed bottom surfaces of the first bonding end portions 24 and 32 are situated on the same plane as the packaging surface 27 so as to form the flat bottom surface of the semiconductor device 20A.

After the melting step, a stud bump forming step is carried out. In the stud bump forming step, the stud bumps 26 that function as mounting terminals are formed on the first bonding end portions 24 of the wires 23. More accurately, the stud bumps 26 are formed on the bottom surfaces of the first bonding end portions 24 exposed through the packaging surface 27 of the resin package 22. The stud bumps 26 can be formed by a conventional technique using a wire bonding machine. It should be noted that the stud bumps 26 are not formed on the first bonding end portions 32 of the detection mark wires 31A. Accordingly, the bottom surfaces of the first bonding end portions 32 remain exposed through the packaging surface 27 of the resin package 22. The exposed bottom surfaces of the first bonding end portions 32 function as the detection marks 30A.

By carrying out all the four steps, the semiconductor device 20A shown in FIG. 3 is completed. This production method eliminates the steps of forming the stud bumps 26 on the first bonding end portions 32, and forming the detection marks 30A. Accordingly, the production method of the present invention is simpler than a conventional semiconductor production method.

The first bonding, which is performed on the wires 23 and the detection mark wires 31A, is nail head bonding. Compared with the stitch bonding that is the second bonding in this embodiment, the nail bonding allows larger bonding portions. Accordingly, the bottom surfaces of the first bonding end portions 24 and 32 each have a large area. As a result, the bonding between the first bonding end portions 24 and the stud bumps 26 can be strengthened, and each of the detection marks 30A can have a large area.

Figure 4D:
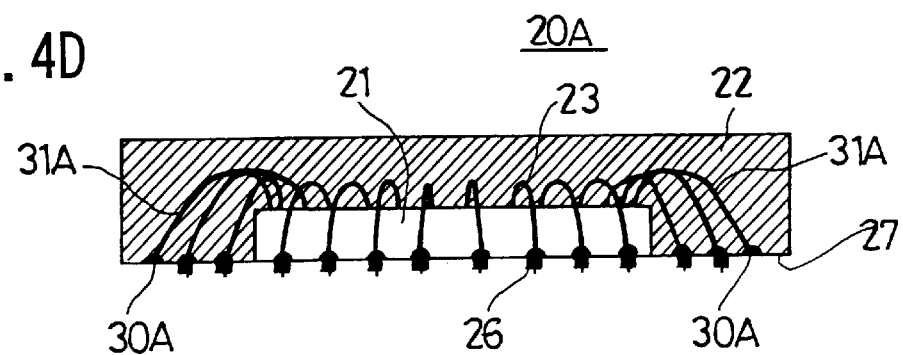

FIG. 5 is a bottom view of a semiconductor device 20B which is a second embodiment of the present invention, and FIG. 6 is a bottom view of a semiconductor device 20C which is a third embodiment of the present invention. In these figures, the same components as in FIGS. 3 to 4D are denoted by the same reference numerals.

The characteristics of the second and third embodiments reside in the positions of the detection marks 30A. The semiconductor device 20B of the second embodiment has the detection marks 30A formed in line with the aligned stud bumps 26. The semiconductor device 20C of the third embodiment has the detection marks 30A formed out of line with the aligned stud bumps 26.

In either of the semiconductor devices 20B and 20C, two detection marks 30A are formed on a diagonal line of the rectangular packaging surface 27 of the resin package 22. Generally, a semiconductor device mounting apparatus detects the position of a semiconductor device based on detection marks formed on a diagonal line.

Figure 7:
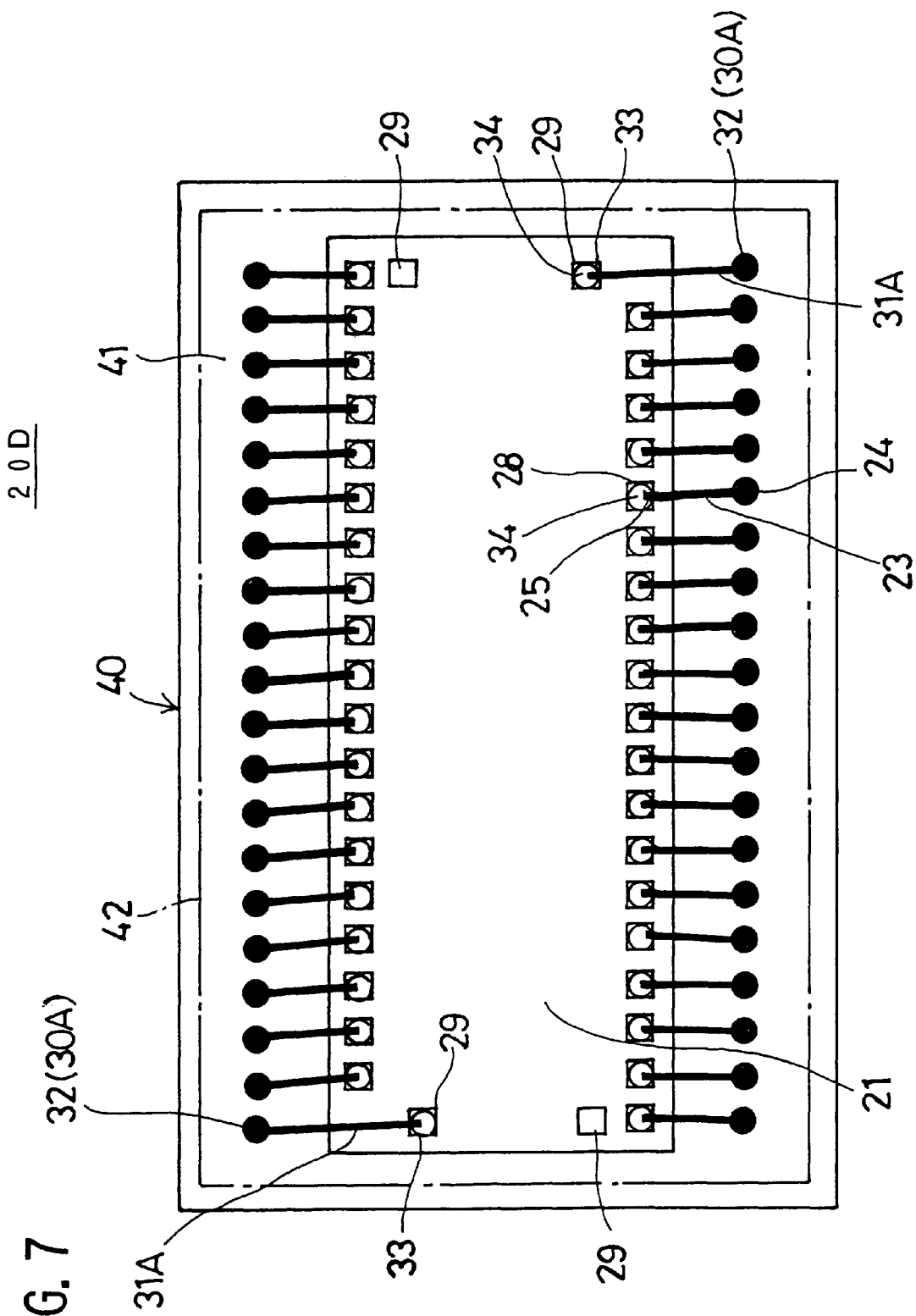
FIG. 7 is a plan view of a semiconductor device after a wire bonding process of a fourth embodiment of the present invention.

FIG. 7 is a plan view of a semiconductor device 20D which is a fourth embodiment of the present invention. For ease of explanation, FIG. 7 shows the semiconductor device 20D after the chip mounting step.

The portion surrounded by one-dotted-lines in FIG. 7 indicates a mold line 42 along which the resin package 22 is to be formed. Connection stud bumps 34 are formed on the respective electrode pads 28 on the semiconductor chip 21, and the second bonding ends of the respective wires 23 and the detection mark wires 31A are bonded to the connection stud bumps 34.

In the semiconductor device 20D of this embodiment, the second bonding end portions 33 of the detection mark wires 31A are connected to non-connection pads 29 formed on the semiconductor chip 21. The non-connection pads 29 are electrode pads which are not involved in electrical connections. Generally, one or more such non-connection pads are formed on a semiconductor chip.

By connecting the second bonding end portions 25 of the detection mark wires 31A to the non-connection pads 29, time loss in the wire bonding process can be reduced. The reasons for this are as follows.

As described before, when the wires 23 and the detection mark wires 31A are formed by the use of a wire bonding machine, it is necessary to input positional information of the wires 23 and the detection mark wires 31A in the memory unit of the wire bonding machine. The data required in the wire bonding process includes the heights and the positional coordinates of the respective wires 23 and the respective detection mark wires 31A at the first bonding points and at the second bonding points.

Each height of the wires 23 and the detection mark wires 31A at the first bonding points is the same as the height of the metal plating film 41, because the first bonding end portions 24 and 32 of the wires 23 and the detection mark wires 31A are bonded to the metal plating film 41. Here, the height of the metal plating film 41 is the same as the height of the packaging surface 27 of the resin package 22.

Each height of the wires 23 and the detection mark wires 31A at the second bonding points is the same as the height of the upper surface of the semiconductor chip 21, because the second bonding end portions 25 and 33 of the wires 23 and the detection mark wires 31A are respectively bonded to the electrode pads 28 and the non-connection pads 29 both formed on the semiconductor chip 21.

By connecting the second bonding end portions 33 of the detection mark wires 31A to the non-connection pads 29 formed on the semiconductor chip 21, each height of the detection mark wires 31A at the second bonding positions can be the same as each height of the wires 23 at the second bonding points. Accordingly, the data of only two heights needs to be inputted in the wire bonding machine, and there is no need to separately input height data of the detection mark wires 31A. In this manner, the positional information input process for the wire bonding machine can be simplified, and the wire bonding process for the wires 23 and the detection mark wires 31A can be carried out in one continuous series of operations. Thus, time loss in the wire bonding process can be considerably reduced.

Figure 8:
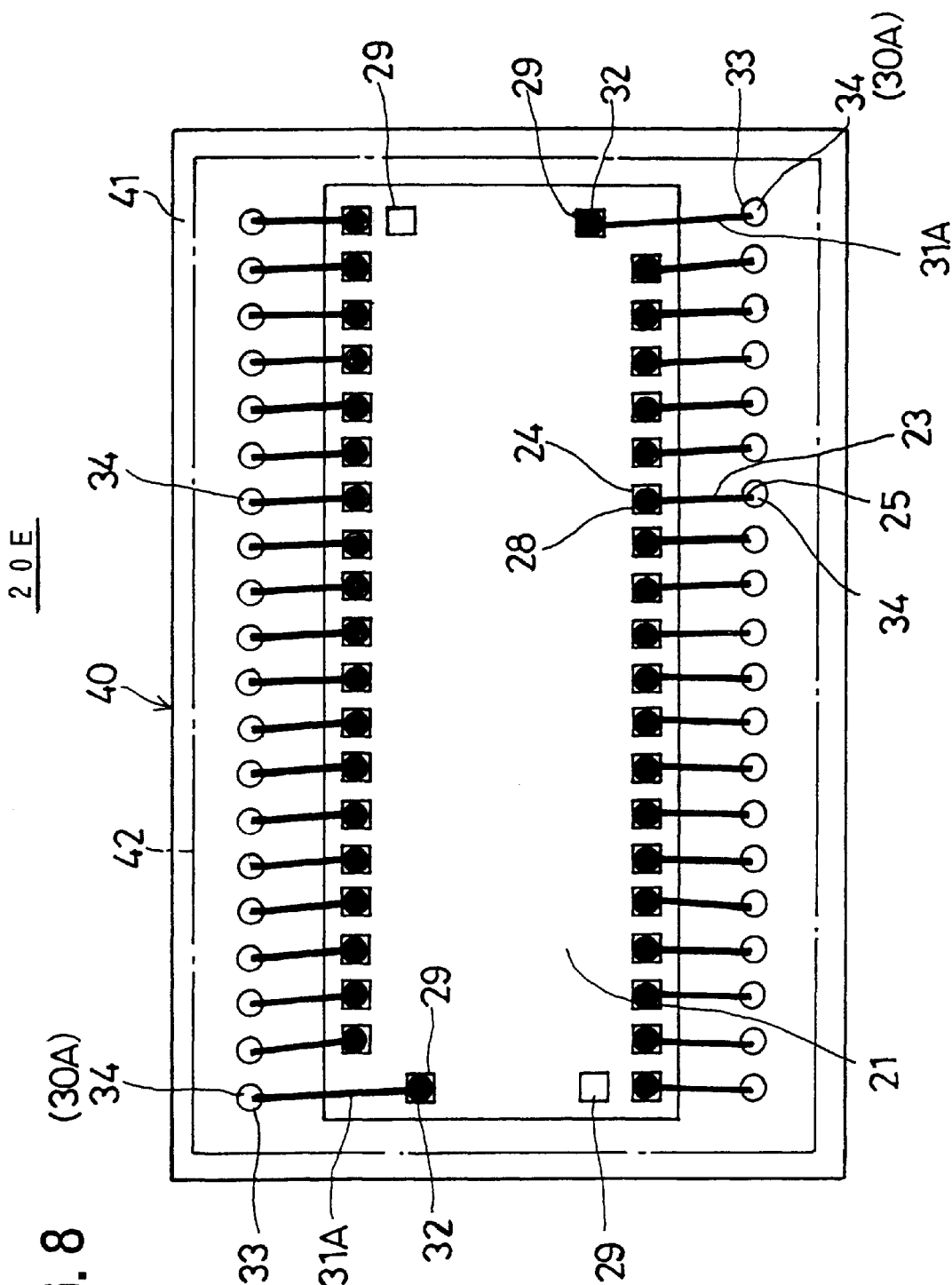
FIG. 8 is a plan view of a semiconductor device after a wire bonding process of a fifth embodiment of the present invention.

FIG. 8 is a plan view of a semiconductor device 20E which is a fifth embodiment of the present invention. For ease of explanation, FIG. 8 shows the semiconductor device 20E after the chip mounting step.

In the semiconductor device 20E of this embodiment, as shown in FIG. 8, the first bonding end portions 24 and 32 of the wires 23 and the detection mark wires 31A are bonded to the electrode pads 28 and the non-connection pads 29, respectively. The second bonding end portions 25 and 33 of the wires 23 and the detection mark wires 31A are bonded to the connection stud bumps 34 formed on the metal plating film 41. Accordingly, the connection stud bumps 34 bonded to the detection mark wires 31A serve as the detection marks 30A in this embodiment, so that the detection marks 30A can be surely detected.

The height of each of the wires 23 at the first bonding end is the same as the height of each of the detection mark wires 31A at the first bonding end (i.e., on the upper surface of the semiconductor chip 21). The height of each of the wires 23 at the second boding end is the same as the height of each of the detection mark wires 31A at the second bonding end (i.e., on the upper surface of the metal plating film 41). Thus, the positional information input process for the wire bonding machine can be simplified, and the wire bonding process for the wires 23 and the detection mark wires 31A can be carried out in one continuous series of operations. Thus, time loss in the wire bonding process can be considerably reduced.

Figure 9:
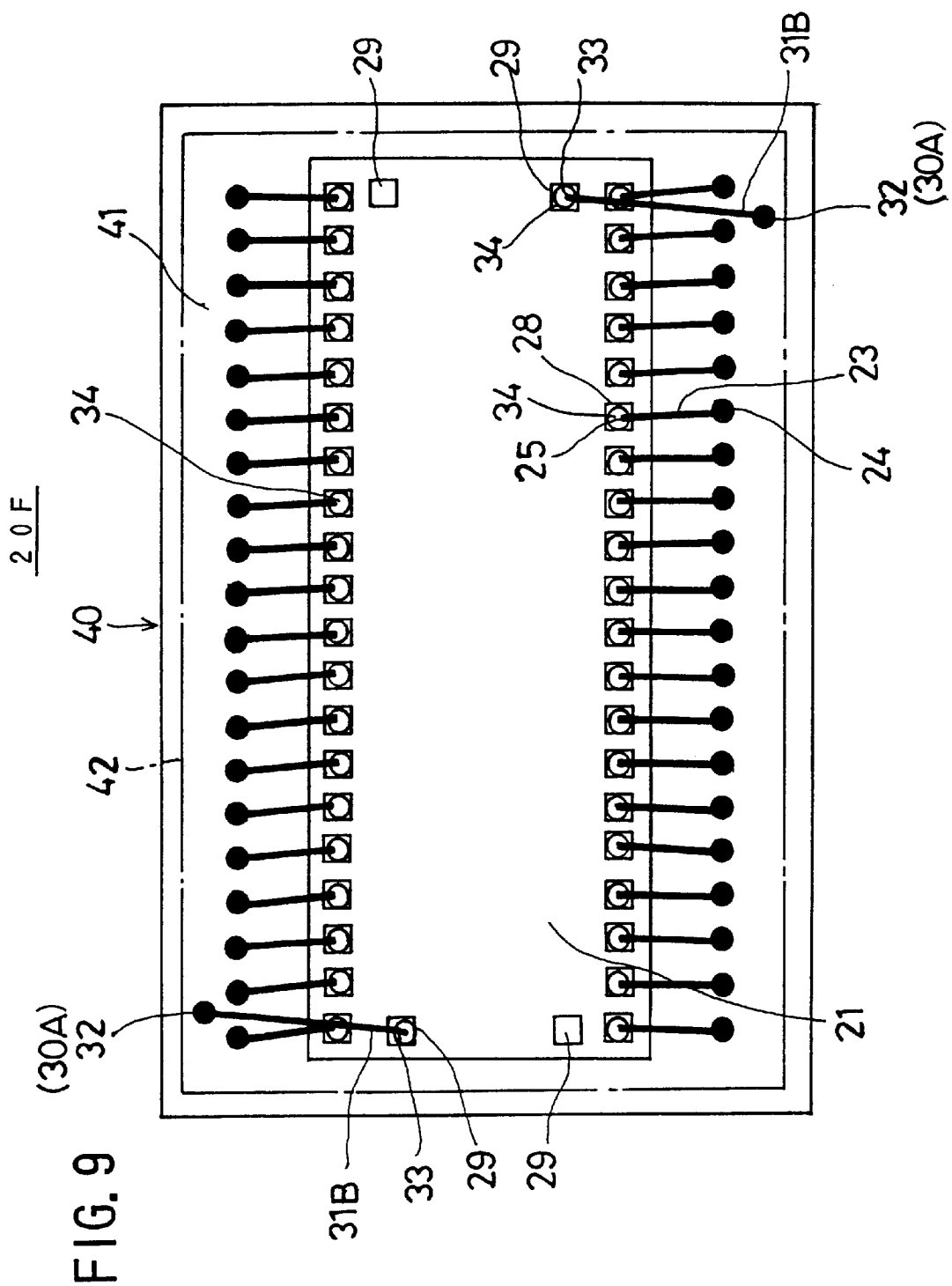
FIG. 9 is a plan view of a semiconductor device after a wire bonding process of a sixth embodiment of the present invention.
Figure 10:
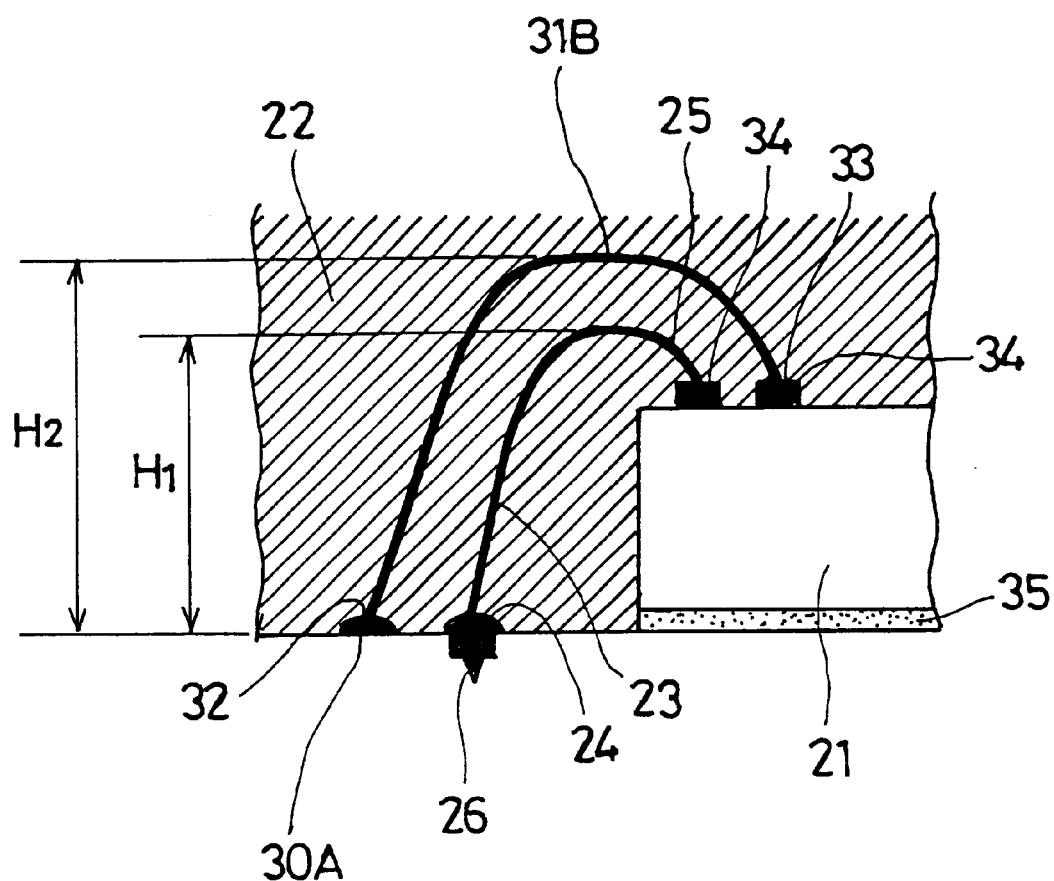
FIG. 10 is an enlarged sectional view of a wire arranged portion of the semiconductor device of the sixth embodiment of the present invention.

FIGS. 9 and 10 show a semiconductor device 20F which is a sixth embodiment of the present invention. For ease of explanation, FIG. 9 shows the semiconductor device 20F after the chip mounting step, and FIG. 10 is an enlarged view of a wire arranged portion of the semiconductor device 20F of this embodiment.

As shown in FIG. 10, this embodiment is characterized in that the wire loop height Hi of a wire 23 is different from the wire loop height H2 of a detection mark wire 31A. More specifically, the wire loop height H2 of the detection mark wire 31A is higher than the wire loop height H1 of the wire 23 in this embodiment (H2>H1). In this structure, each detection mark 30A can be formed by a detection mark wire 31B, regardless of the position of each non-connection pad 29 on the semiconductor chip 21.

As shown in FIG. 9, the locations of the electrode pads 28 and the non-connection pads 29 on the semiconductor chip 21 are set with no consideration of bonding the detection mark wires 31B to the non-connection pads 29. If the wire loop height of each wire 23 is the same as the wire loop height of each detection mark wire 31B in this embodiment, the wires 23 and the detection mark wires 31B might interfere with each other. To avoid such a situation, the locations of the non-connection pads 29 can be changed. However, making such a change to the semiconductor chip 21 is not a realistic solution, because it will lead to an increase in cost.

For this reason, the wire loop height H1 of each wire 23 differs from the wire loop height H2 of each detection mark wire 31A, so that the detection marks 30A can be formed by the detection mark wires 31A without causing the wires 23 and the detection mark wires 31B to interfere with each other, regardless of the locations of the electrode pads 28 and the non-connection pads 29. This can be achieved without an increase in cost.

Figure 11:
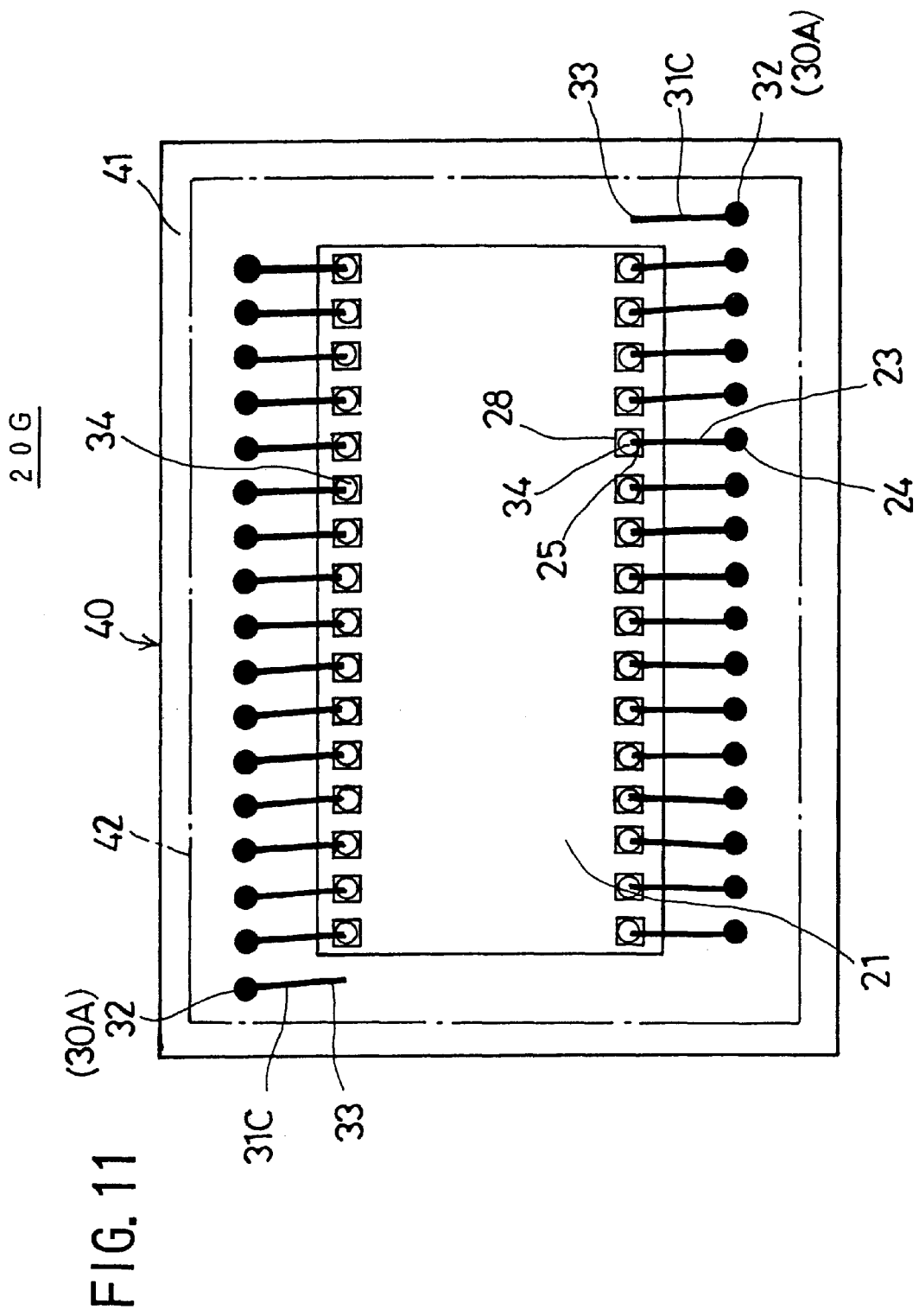
FIG. 11 is a plan view of a semiconductor device after a wire bonding process of a seventh embodiment of the present invention.
Figure 12A:
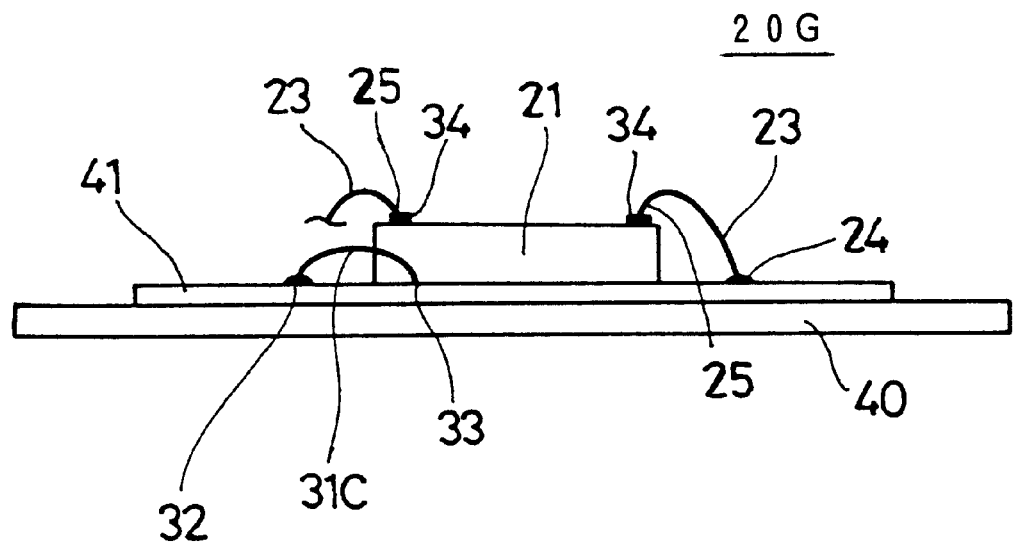
FIGS. 12A and 12B illustrate the semiconductor device of the seventh embodiment of the present invention.
Figure 12B:
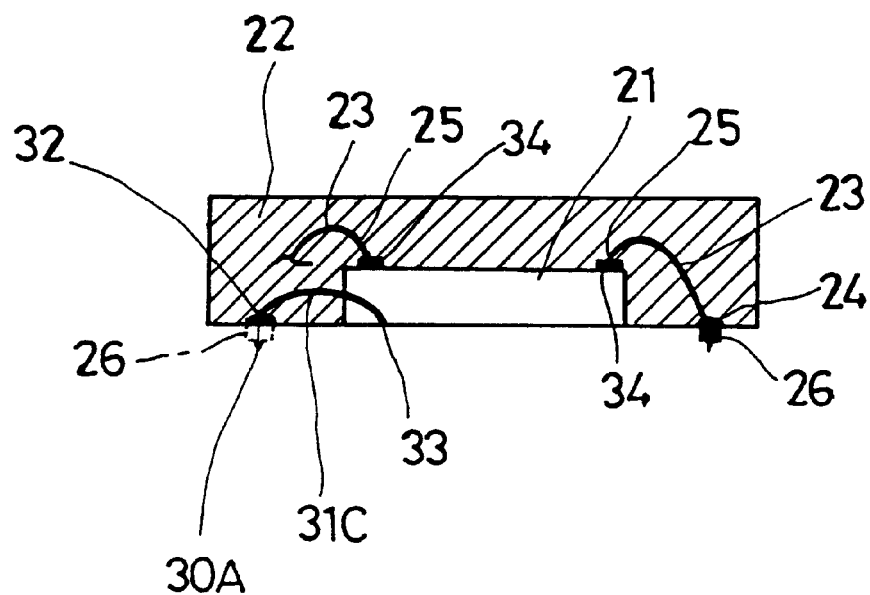

FIGS. 11 to 12B show a semiconductor device 20G which is a seventh embodiment of the present invention. More specifically, FIG. 11 is a plan view of the semiconductor device 20G after the chip mounting step, FIG. 12A is a side view of the semiconductor device 20G shown in FIG. 11, and FIG. 12B is a sectional view of the semiconductor device 20G.

In the foregoing embodiments, one end of each of the detection mark wires 31A or 31B is exposed through the resin package 22 to form a detection mark 30A, while the other end is connected to the semiconductor chip 21. In the semiconductor device 20G of this embodiment, on the other hand, detection mark wires 31C form the detection marks 30A at one end, while the other end terminates within the resin package 22.

More specifically, the first bonding end portions 32 of the detection mark wires 31C are exposed through the packaging surface 27 of the resin package 22 so as to form the detection marks 30A. Meanwhile, the second bonding end portions 33 of the detection mark wires 31C are terminated within the resin package 22.

To terminate the second bonding end portions 33 within the resin package 22, the first bonding is carried out to bond the first bonding end portions 32 of the detection mark wires 31C to the metal plating film 41 on the lead frame 40, and the second bonding is carried out to bond the second bonding end portions 33 to the metal plating film 41 on the lead frame 40 in the chip mounting step, as shown in FIG. 12A. The resin package 22 is then formed in the encapsulation step, followed by the melting step to eliminate the lead frame 40 and the metal plating film 41. After that, the stud bump forming step is carried out to form the stud bumps 26 only on the first bonding end portions 24.

FIG. 12B shows the semiconductor device formed in the above manner. As shown in FIG. 12B, the second bonding end portions 33 of the detection mark wires 31C are bonded to the metal plating film 41 in the chip mounting step, so that the second bonding end portions 33 are terminated within the resin package 22. Here, the second bonding end portions 33 are partially exposed through the resin package 22, but the exposed area is small, because the second bonding end portions 33 are stitch-bonded. Accordingly, the second bonding end portions 33 do not hinder the detection of the positions of the detection marks 30A.

With the structure of this embodiment, the detection marks 30A can be formed, even if no non-connection pads 29 exist on the semiconductor chip 21, or if the bonding between the detection mark wires 31C and the non-connection pads 29 is difficult.

Figure 13:
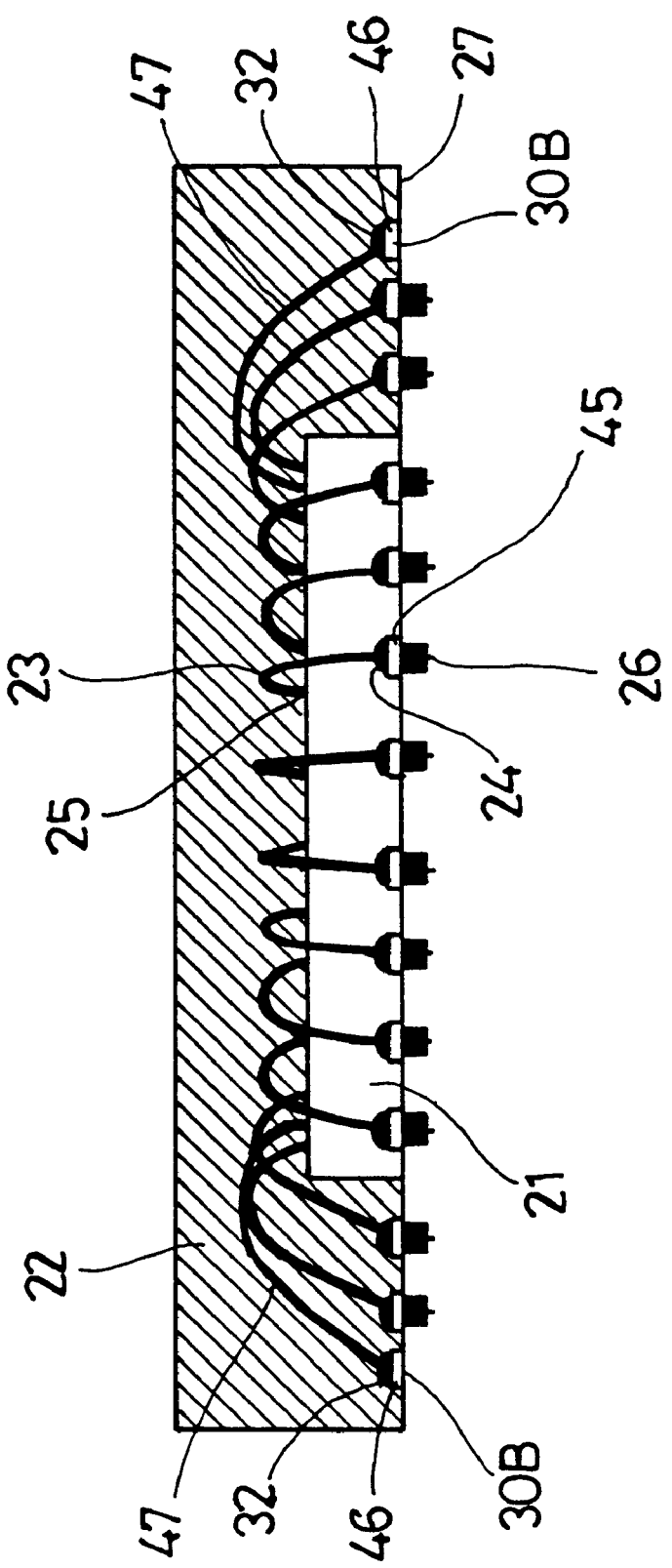
FIG. 13 is a sectional view of a semiconductor device of an eighth embodiment of the present invention.

FIG. 13 is a sectional view of a semiconductor device 20H which is an eighth embodiment of the present invention. The semiconductor device 20H of this embodiment is different from the semiconductor device 20A of the first embodiment shown in FIG. 3 in that detection mark reinforcing wires 47, connection metal films 45, and detection mark metal films 46 are employed.

The connection metal films 45 and the detection mark metal films 46 are conductive metal pads. The first bonding end portions 24 of the wires 23 are bonded to the upper surfaces of the connection metal films 45, and the stud bumps 26 as the mounting terminals are formed on the connection metal films 45 exposed through the packaging surface 27 of the resin package 22.

Meanwhile, the first bonding end portions 32 of the detection mark reinforcing wires 47 are bonded to the upper surfaces of the detection mark metal films 46, which are exposed through the packaging surface 27. It should be understood that the detection mark reinforcing wires 47 have the same structure as the detection mark wires 31A of the semiconductor device 20A of the first embodiment.

This embodiment is characterized in that the detection mark metal films 46 exposed through the packaging surface 27 are used as detection marks 30B for positioning the stud bumps 26. The detection marks 30B form a flat surface with the packaging surface 27. Accordingly, the light reflectance is high at the detection marks 30B. When a detection process is carried out for the semiconductor device 20H, less light will scatter at the detection marks 30B, and a larger amount of light will be received by a CCD camera. Thus, the detection marks 30B can be accurately detected, and the reliability in the mounting of the semiconductor device 20H on a printed circuit board (not shown) can be improved.

In this embodiment, the detection mark metal films 46 that constitute the detection marks 30B are not simply formed on the resin package 27, but also are connected to the detection mark reinforcing wires 47. The detection mark reinforcing wires 47 serve as anchors within the resin package 22 so as to prevent the detection mark metal films 46 from separating from the resin package 22.

Referring now to FIGS. 14A to 14D, a method of producing the semiconductor device 20H having the detection marks 30B will be described.

Figure 14A:
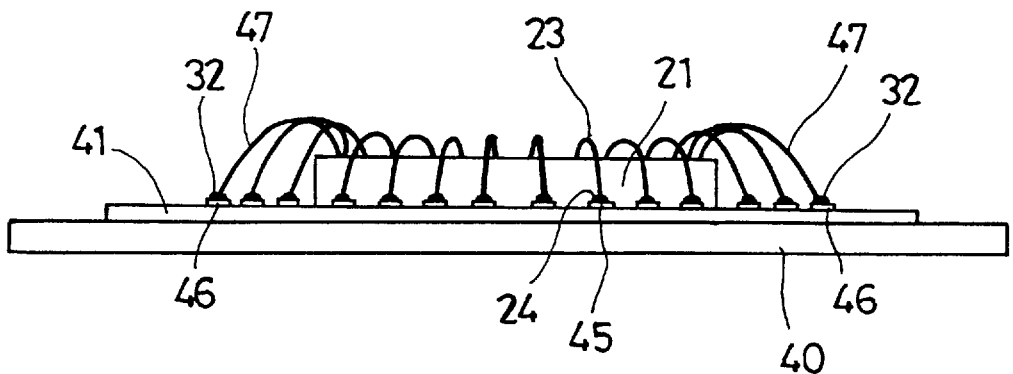
FIGS. 14A to 14D illustrate a method of producing the semiconductor device of the eighth embodiment of the present invention.

First, the lead frame 40 having the metal plating film 41 formed thereon is prepared, as shown in FIG. 14A. A metal film to be the connection metal films 45 and the detection mark metal films 46 is formed on the metal plating film 41 by a plating technique. Etching is then performed on the metal film with the use of a mask on which the patterns of the connection metal films 45 and the detection mark metal films 46 are formed. The unnecessary portions of the metal film are thus removed to form the connection metal films 45 and the detection mark metal films 46. Since the connection metal films 45 and the detection mark metal films 46 are simultaneously formed as described above, there is no need to employ an individual step of forming the detection mark metal films 46.

After the connection metal films 45 and the detection mark metal films 46 are formed on the metal plating film 41, the semiconductor chip 21 is mounted on the metal plating film 41 on the lead frame 40 with adhesive. The lead frame 40 having the semiconductor chip 21 mounted thereon is then set to a wire bonding machine to arrange the wires 23 and the detection mark reinforcing wires 47. In this manner, the detection mark reinforcing wires 47 can be formed at the same time as the wires 23.

At the time of arranging the wires 23 and the detection mark reinforcing wires 47, the first bonding is performed on the connection metal films 45 and the detection mark metal films 46 so as to form the first bonding end portions 24 and 32. The wires 23 are thus bonded to the connection metal films 45, and the detection mark reinforcing wires 47 are bonded to the detection mark metal films 46. The metal films 45 and 46 are made of a material which has high bonding ability with the wires 23 and the detection mark reinforcing wires 47.

After the formation of the first bonding end portions 24 and 32, the wires 23 and the detection mark reinforcing wires 47 are pulled toward the upper surface of the semiconductor chip 21, and the second bonding is performed on the electrode pads on the semiconductor chip 21. FIG. 14A shows the wires 23 and the detection mark reinforcing wires 47 already bonded to the semiconductor chip 21, and the procedures described above constitutes the chip mounting step of this embodiment.

Figure 14B:
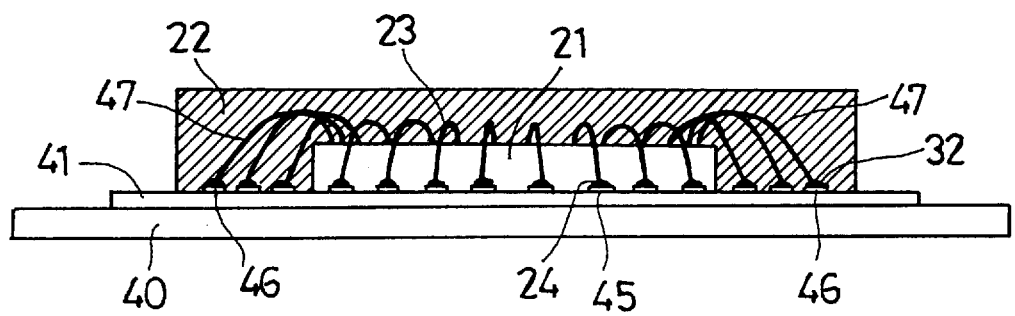
Figure 14C:
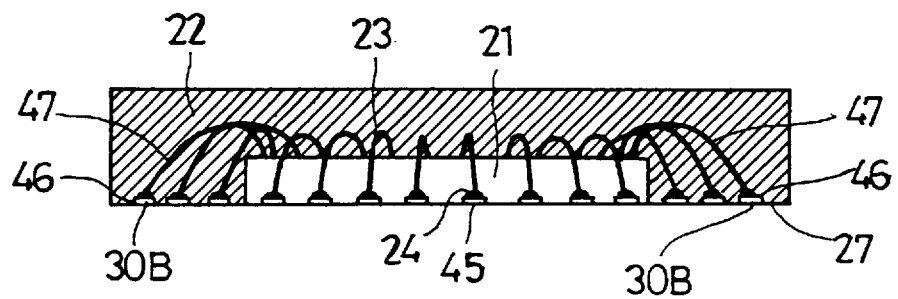
Figure 14D:
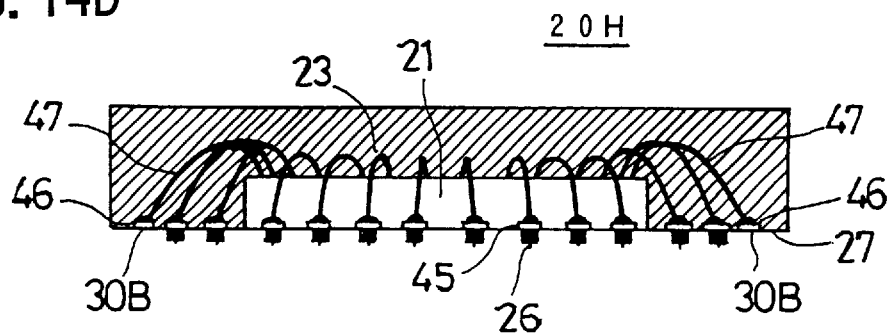

After the chip mounting step, the encapsulation step is carried out to form the resin package 22 for encapsulating the semiconductor chip 21, the wires 23, and the detection mark reinforcing wires 47 on the lead frame 40, as shown in FIG. 14B, followed by the melting step to remove the lead frame 40 and the metal plating film 41 from the resin package 22. The etching liquid used in the melting step melts the lead frame 40 and the metal plating film 41, but not the metal films 45 and 46. As a result, the bottom surfaces of the metal films 45 and 46 are exposed through the packaging surface 27 of the resin package 22, as shown in FIG. 14C. The exposed bottom surfaces of the metal films 45 and 46 form a flat surface with the packaging surface 27.

After the melting step, the stud bump forming step is carried out to form the stud bumps 26 as the mounting terminals on the exposed surfaces of the connection metal films 45. In the stud bump forming step, the stud bumps 26 are not formed on the detection mark metal films 46. In other words, the bottom surfaces of the detection mark metal films 46 remain exposed through the packaging surface 27 of the resin package 22. The exposed bottom surfaces of the detection mark metal films 46 function as the detection marks 30B. By carrying out the above steps, the semiconductor device 20H shown in FIG. 13 is produced.

According to the above production method, the detection marks 30B can be easily formed by not forming the stud bumps 26 on the detection mark metal films 46. Thus, the detection marks 30B can be formed without complicating the production method.

Figure 15:
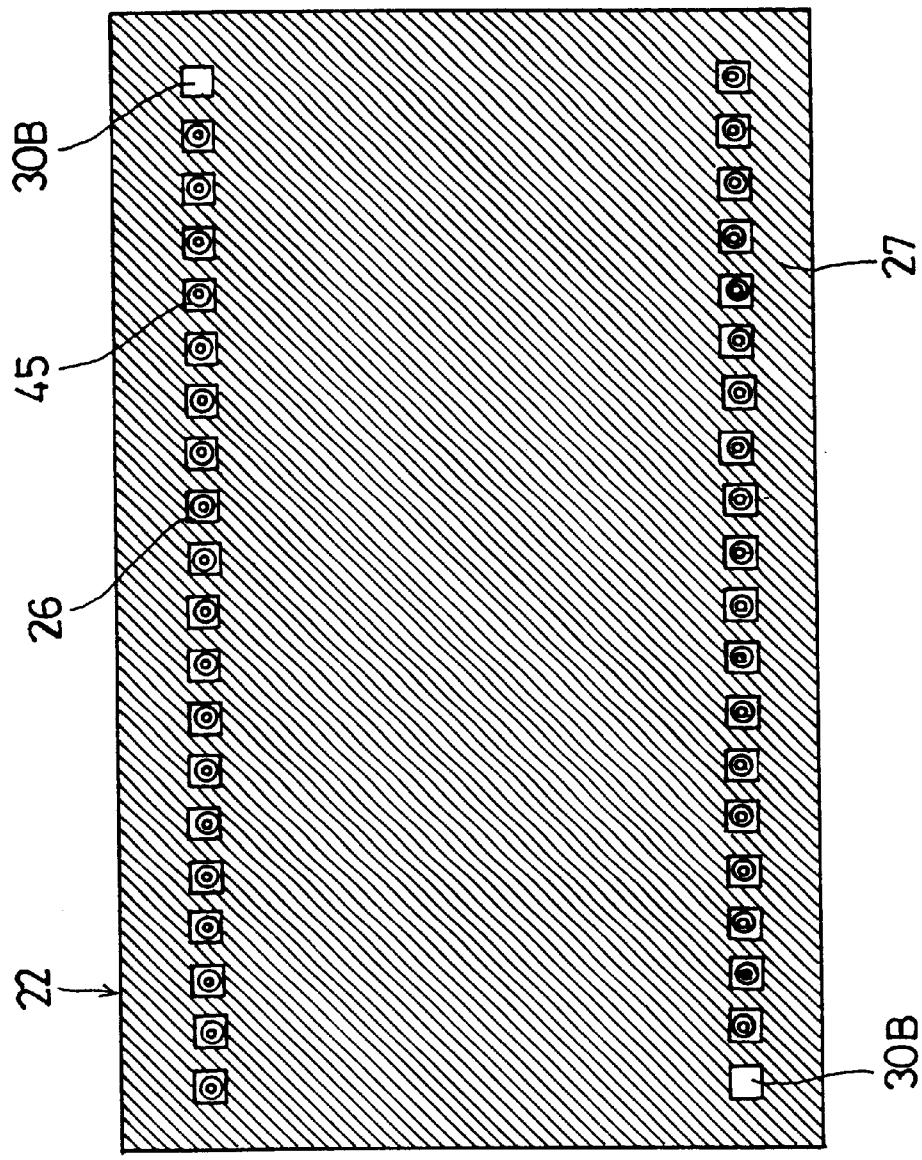
FIG. 15 is a bottom view of a semiconductor device of a ninth embodiment of the present invention.
Figure 16:
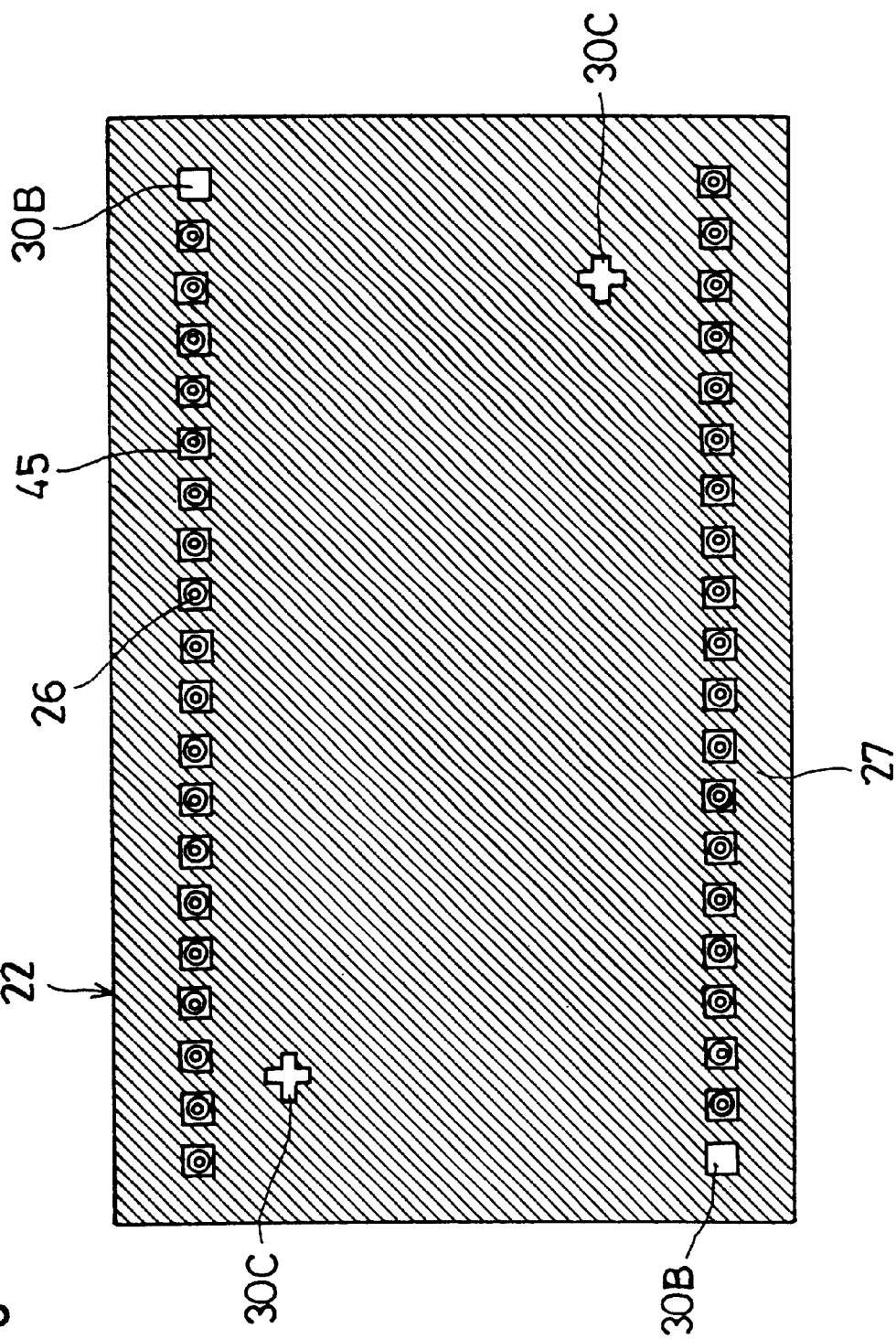
FIG. 16 is a bottom view of a semiconductor device of a tenth embodiment of the present invention.
Figure 17:
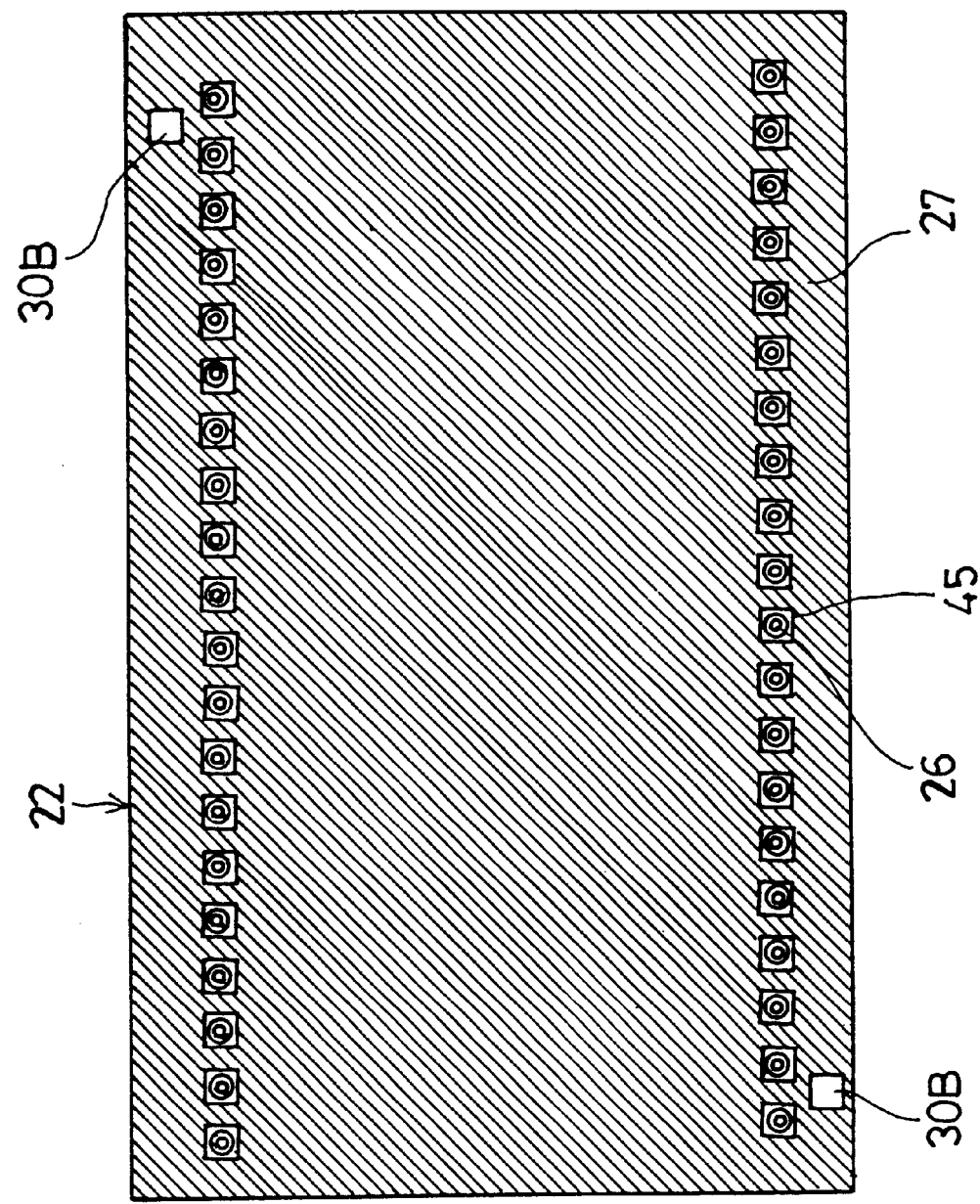
FIG. 17 is a bottom view of a semiconductor device of an eleventh embodiment of the present invention.

FIG. 15 is a bottom view of a semiconductor device 20I which is a ninth embodiment of the present invention, FIG. 16 is a bottom view of a semiconductor device 20J which is a tenth embodiment of the present invention, and FIG. 17 is a bottom view of a semiconductor device 20K which is an eleventh embodiment of the present invention.

Each of the semiconductor devices 20I to 20K is characterized by the location of the detection marks 30B. The semiconductor device 20I of the ninth embodiment has the detection marks 30B formed in line with the aligned stud bumps 26. The semiconductor device 20J of the tenth embodiment has cross-shaped detection marks 30C formed inside the rows of stud bumps 26, as well as the detection marks 30B formed in line with the aligned stud bumps 26. The semiconductor device 20K of the eleventh embodiment has the detection marks 30B formed outside the rows of stud bumps 26.

Since the detection mark wires 31A to 31C form the detection marks 30A in the first to seventh embodiments, the detection marks 30A all have circular shapes. However, circular detection marks are difficult for some detection device to detect.

Such a problem can be eliminated by the detection mark metal films 46 serving as the detection marks 30B, because the detection mark metal films 46 can have any shape, such as a rectangular shape, a cross-like shape, or a T shape. The shapes of the detection mark metal films 46 can be easily changed, because the mask patterns used for forming the detection mark metal films 46 in the chip mounting step can be easily changed.

In this manner, the detection marks 30B and 30C formed by the detection mark metal films 46 have a shape detectable by any detection device. Thus, the reliability in the mark detection process can be improved, and each semiconductor device can be accurately positioned onto a printed circuit board.

Figure 18:
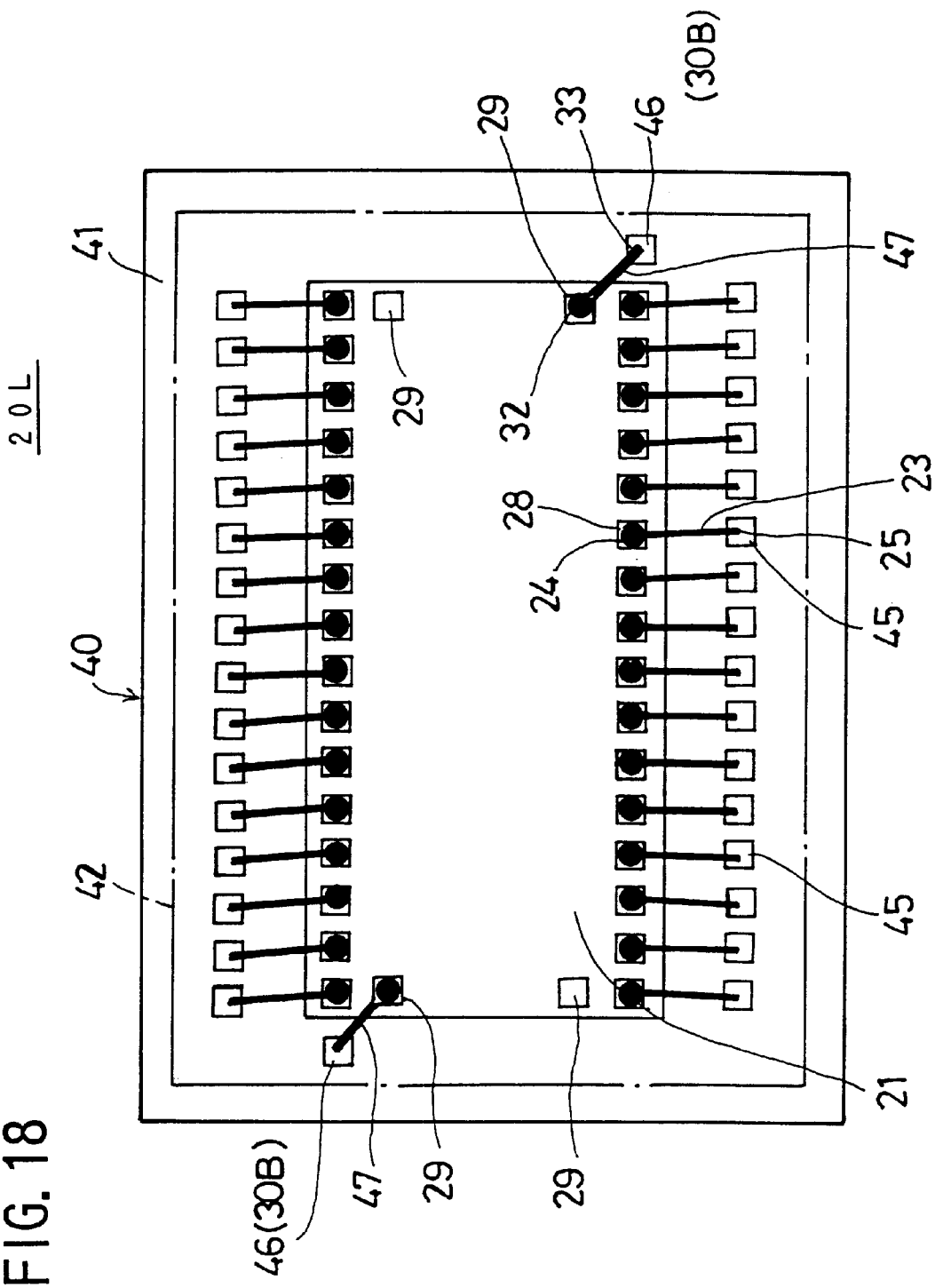
FIG. 18 is a plan view of a semiconductor device after a wire bonding process of a twelfth embodiment of the present invention.

FIG. 18 is a plan view of a semiconductor device 20L which is a twelfth embodiment of the present invention. For ease of explanation, FIG. 18 shows the semiconductor device 20L after the chip mounting step.

In FIG. 18, the portion surrounded by one-dotted-lines indicate the mold line 42 along which the resin package 22 is to be formed. The electrode pads 28 and the non-connection pads 29 are formed on the semiconductor chip 21, and the first bonding end portions 24 and 32 of the wires 23 and the detection mark reinforcing wires 47 are bonded to the electrode pads 28 and the non-connection pads 29, respectively.

In the semiconductor device 20L of this embodiment, the first bonding end portions 32 of the detection mark reinforcing wires 47 are bonded to the non-connection pads 29 as described above, while the second bonding end portions 33 of the detection mark reinforcing wires 47 are bonded to the detection mark metal films 46. By connecting the first bonding end portions 32 of the detection mark reinforcing wires 47 to the non-connection pads 29, time loss in the wire bonding process can be reduced.

More specifically, by connecting the first bonding end portions 32 of the detection mark reinforcing wires 47 to the non-connection pads 29, the height of each detection mark reinforcing wire 47 at the first bonding end can be the same as the height of each wire 23 at the first bonding end. Here, the height of each detection mark reinforcing wire 47 at the second bonding end is also the same as the height of each wire 23 at the second bonding end. Therefore, to input the bonding information into a wire bonding machine, only two heights need to be set in the wire bonding machine, and there is no need to set a different height for the detection mark reinforcing wires 47.

In this manner, the positional information input process for the wire bonding machine can be simplified, and the wire bonding process for the wires 23 and the detection mark reinforcing wires 47 can be carried out in one continuous series of operations. Thus, time loss in the wire bonding process can be considerably reduced.

In this embodiment, the detection mark reinforcing wires 47 are bonded to the detection mark metal films 46 at one end, while bonded to the non-connection pads 29 buried in the resin package at the other end. Accordingly, the detection mark metal films 46 are attached to the resin package 22 via the detection mark reinforcing wires 47. The bond between the detection mark metal films 46 and the resin package 22 is thus strong enough to prevent the detection mark metal films 46 from separating from the resin package 22.

Figure 19:
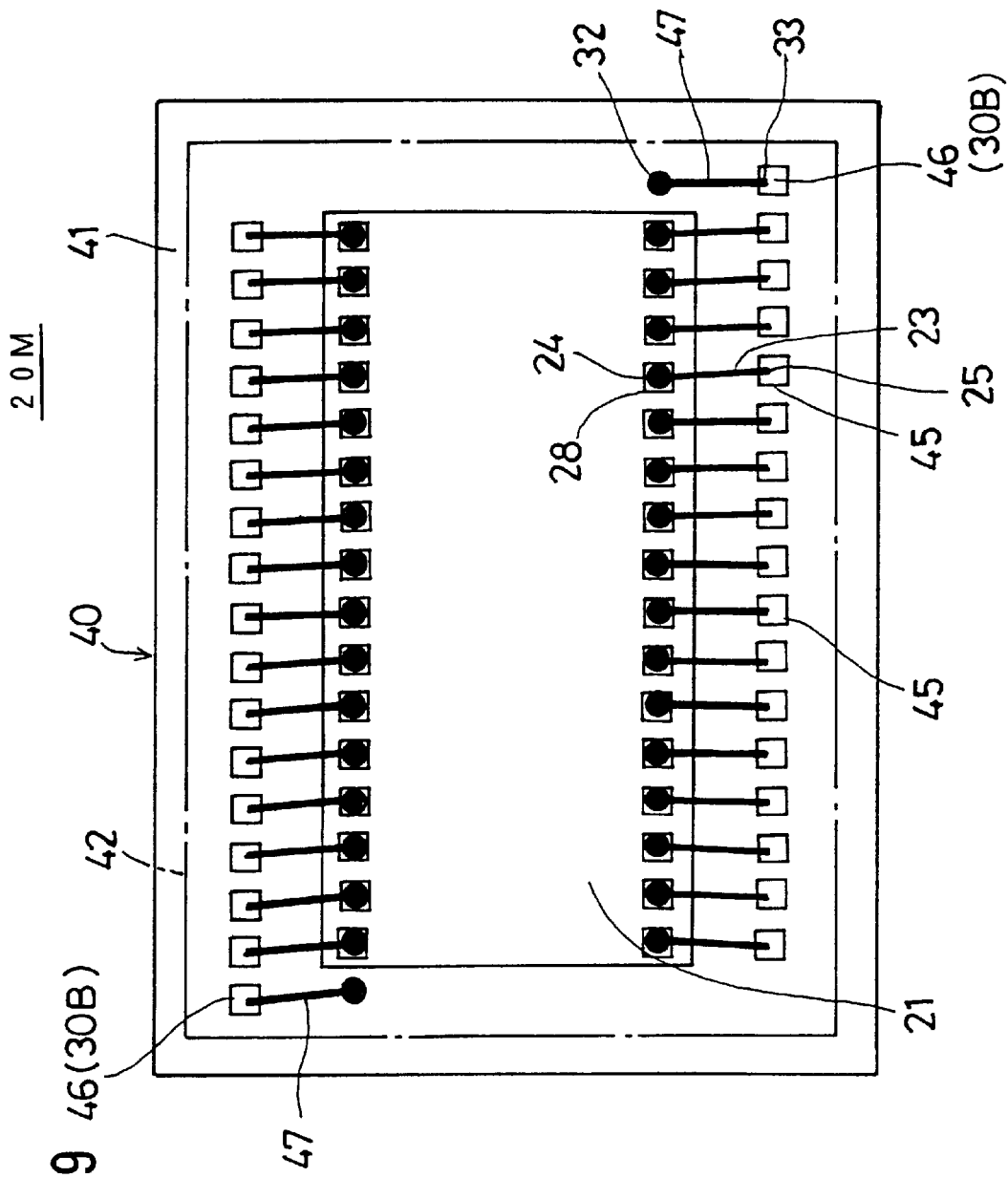
FIG. 19 is a plan view of a semiconductor device after a wire bonding process of a thirteenth embodiment of the present invention.

FIG. 19 is a plan view of a semiconductor device 20M which is a thirteenth embodiment of the present invention. For ease of explanation, FIG. 19 shows the semiconductor device 20M after the chip mounting step.

In the semiconductor device 20M of this embodiment, the detection mark reinforcing wires 47 are connected to the detection mark metal films 46 (or the detection marks 30A) at one end, while terminated within the resin package 22 at the other end. More specifically, the second bonding end portions 33 of the detection mark reinforcing wires 47 are bonded to the detection mark metal films 46, while the first bonding end portions 32 of the detection mark reinforcing wires 47 are terminated within the resin package 22.

To terminate the first bonding end portions 32 within the resin package 22, the first bonding is carried out to bond the first bonding end portions 32 of the detection mark reinforcing wires 47 to the metal plating film 41 on the lead frame 40, and the second bonding is carried out to bond the second bonding end portions 33 to the detection mark metal films 46 in the chip mounting step. The resin package 22 is then formed in the encapsulation step, followed by the melting step to eliminate the lead frame 40 and the metal plating film 41. After that, the stud bump forming step is carried out to form the stud bumps 26 only on the connection metal films 45. In this manner, the first bonding end portions 32 of the detection mark reinforcing wires 47 are terminated within the resin package 22, as shown in FIG. 19.

With the structure of this embodiment, the detection marks 30B can be formed, even if no non-connection pads 29 exist on the semiconductor chip 21, or if the bonding between the detection mark reinforcing wires 47 and the non-connection pads 29 is difficult.

Figure 20:
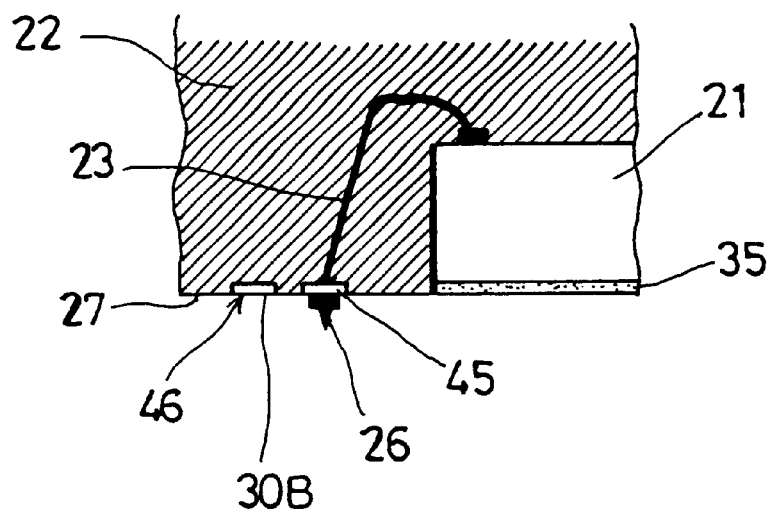
FIG. 20 is an enlarged sectional view of a wire arranged portion of a semiconductor device of a fourteenth embodiment of the present invention.

FIG. 20 is an enlarged partial sectional view of a semiconductor device 20N which is a fourteenth embodiment of the present invention.

In the eighth to thirteenth embodiments, the detection mark reinforcing wires 47 are connected to the detection mark metal films 46, so that the detection mark metal films 46 are prevented from separating from the resin package 22. However, the detection mark reinforcing wires 47 are not essential, and may be omitted, as in this embodiment. In such a case, the resin package 22 should be made of a material having good bonding properties, or the detection mark metal films 46 should have rough surfaces, so that the bond between the resin package 22 and the detection mark metal films 46 can be strong enough to prevent separation.

Figure 21:
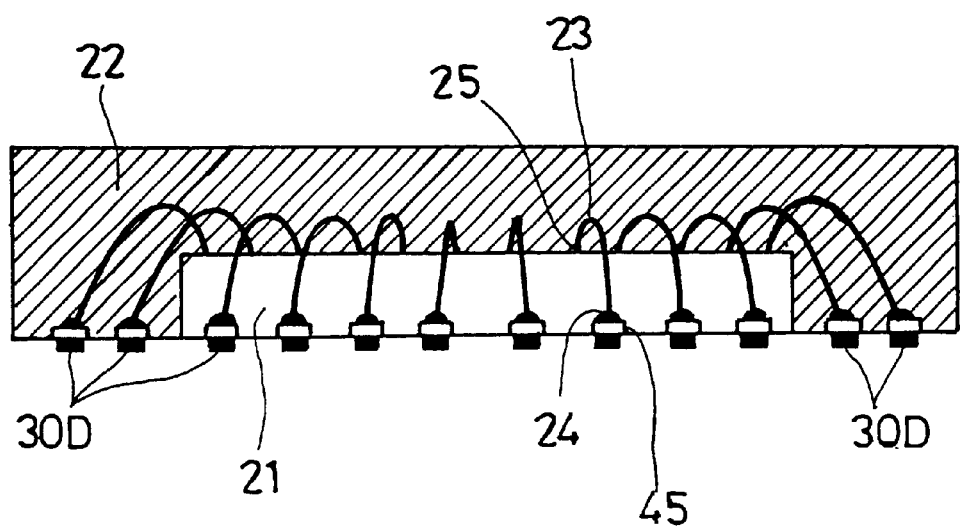
FIG. 21 is a sectional view of a semiconductor device of a fifteenth embodiment of the present invention.

FIG. 21 is a sectional view of a semiconductor device 20O which is a fifteenth embodiment of the present invention.

In the first to fourteenth embodiments described so far, the detection mark wires 31A to 31C or the detection mark reinforcing wires 47 and the detection mark metal films 46 are employed, as well as the wires 23 and the connection metal films 45 on which the stud bumps 26 are formed.

In the semiconductor device 20O of this embodiment, on the other hand, neither detection mark wires 31A to 31C nor the detection mark metal films 46 are employed, and the stud bumps 26 are used as detection marks 30D. More specifically, the top ends of the stud bumps 26 formed on the connection metal films 45 are leveled to form flat top surfaces which serve as the detection marks 30D.

Accordingly, the light reflectance is high at the detection marks 30D. When a position detecting process is carried out for the semiconductor device 20O, less light will scatter at the detection marks 30D, and a larger amount of light will be received by a CCD camera. Thus, the detection marks 30D can be accurately detected, and the reliability in the mounting of the semiconductor device 20O on a printed circuit board (not shown) can be improved.

Since there is no need to form the detection mark wires 31A to 31C and the detection mark metal films 46 in this embodiment, the semiconductor device 20O can be produced at lower cost. Although the stud bumps 26 are formed on the connection metal films 45 in FIG. 21, they can also be formed on the wires 23.

Referring now to FIGS. 22A to 24B as well as FIGS. 14A to 14D, a method of producing the semiconductor device 20O having the detection marks 30D will be described.

First, the lead frame 40 having the metal plating film 41 formed thereon is prepared, as shown in FIG. 14A. A second metal film to provide the connection metal films 45 is formed on the entire upper surface of the metal plating film 41 by a plating technique. Etching is then performed on the second metal film with the use of a mask on which the patterns of the connection metal films 45 are formed. While the detection mark metal films 46 are formed in FIG. 14A, only connection metal films 45 are formed in this embodiment.

After the connection metal films 45 are formed on the metal plating film 41, the semiconductor chip 21 is mounted on the metal plating film 41 on the lead frame 40 with adhesive. The lead frame 40 having the semiconductor chip 21 mounted thereon is then set to a wire bonding machine to arrange only the wires 23. While the detection mark reinforcing wires 47 are formed in FIG. 14A, only the wires 23 are formed in this embodiment. This procedure constitutes the chip mounting step of this embodiment.

After the chip mounting step, the encapsulation step is carried out to form the resin package 22 for encapsulating the semiconductor chip 21 and the wires 23 on the lead frame 40, as shown in FIG. 14B, followed by the melting step to remove the lead frame 40 and the metal plating film 41 from the resin package 22. As a result, the bottom surfaces of the metal films 45 are exposed through the packaging surface 27 of the resin package 22. After the melting step, the stud bump forming step is carried out to form the stud bumps 26 as the mounting terminals on the exposed surfaces of the connection metal films 45.

Figure 22A:
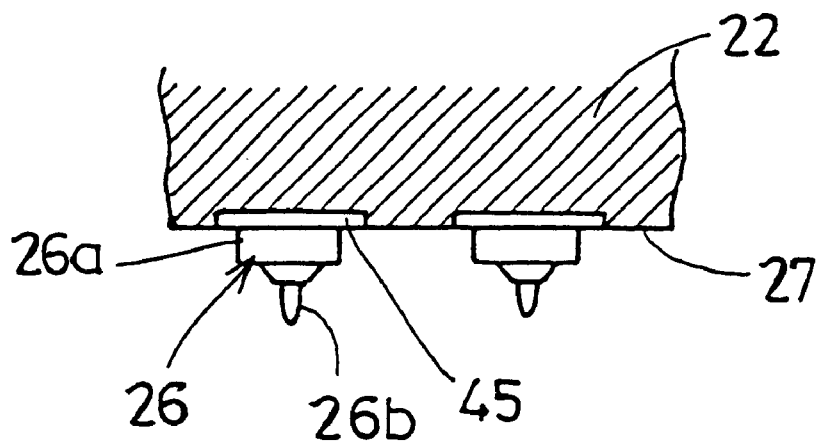
FIGS. 22A and 22B illustrate a method of producing the semiconductor device of the fifteenth embodiment of the present invention.
Figure 22B:
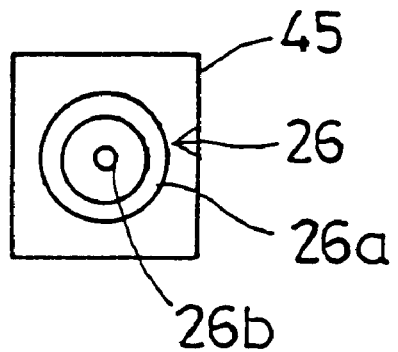

FIG. 22A is an enlarged view of the stud bumps 26 formed on the connection metal films 45, and FIG. 22B is a bottom view of one of the stud bumps 26. As shown in these figures, each of the stud bumps 26 comprises a bonding portion 26a bonded to each corresponding connection metal film 45, and a protruding portion 26b situated under the bonding portion 26a. The bonding portion 26a and the protruding portion 26b each have a curved surface. Accordingly, when a stud bump 26 is irradiated with light, the light will scatter on the surfaces of the bonding portion 26a and the protruding portion 26b, as mentioned before.

Figure 23:
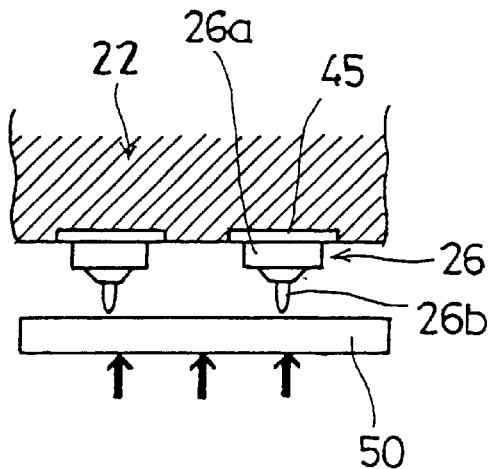
FIG. 23 illustrates the method of producing the semiconductor device of the fifteenth embodiment of the present invention.

To avoid such a problem in this embodiment, the top ends of the stud bumps 26 are leveled with the use of a leveling board 50, as shown in FIG. 23. This process will be hereinafter referred to as the top end leveling step. More specifically, the leveling board 50 is pressed against the stud bumps 26 so as to deform them. Thus, the top ends of the stud bumps 26 can have flat surfaces.

Figure 24A:
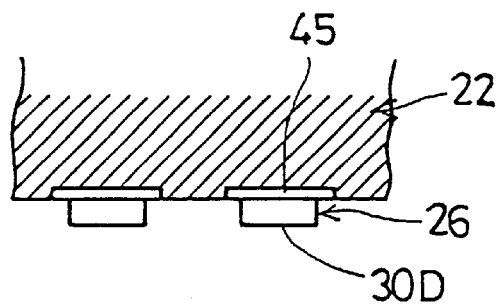
FIGS. 24A and 24B illustrate the method of producing the semiconductor device of the fifteenth embodiment of the present invention.
Figure 24B:
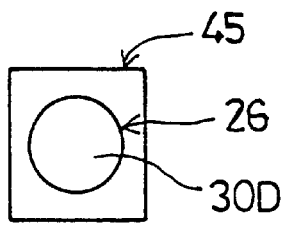

FIG. 24A is a side view of the stud bumps 26 after the top end leveling step, and FIG. 24B is a bottom view of one of the stud bumps 26 after the top end leveling step. As shown in these figures, the stud bumps 26 have flat top ends which can be used as the detection marks 30D. The top end leveling step is simple and effective, because the leveling can be performed collectively for all the stud bumps 26 with the use of the leveling board 50.

Figure 25:
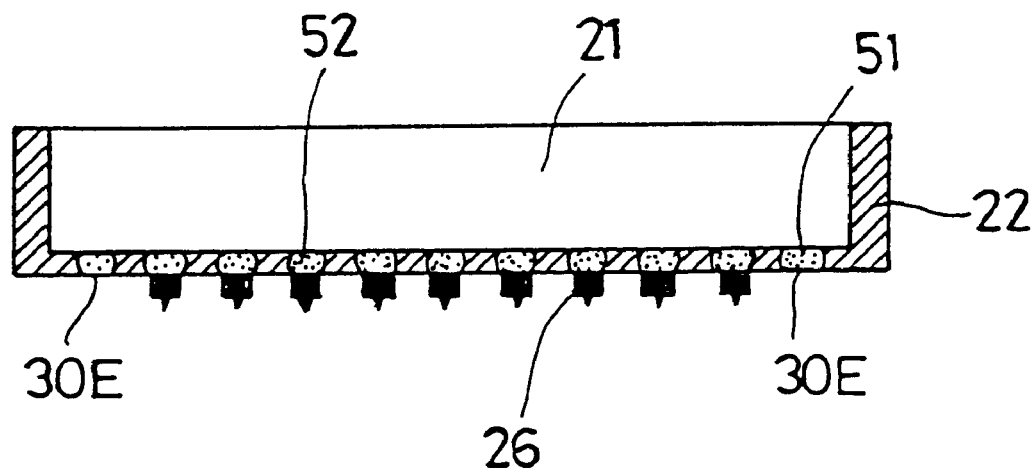
FIG. 25 is a sectional view of a semiconductor device of a sixteenth embodiment of the present invention.

FIG. 25 is a sectional view of a semiconductor device 20P which is a sixteenth embodiment of the present invention.

In the embodiments described so far, the semiconductor chip 21 is mounted in the semiconductor device in a face-up fashion. In the semiconductor device 20P of this embodiment, on the other hand, the semiconductor chip 21 is mounted in the device in a face-down fashion.

By mounting the semiconductor chip 21 in the semiconductor device 20P in the face-down fashion, the wire loops can be eliminated, and the size of the semiconductor device 20P can be minimized. More particularly, the shape of the resin package 22 can be made similar to the semiconductor chip 21 to obtain a CSP-type semiconductor device (CSP: Chip Size Package).

The semiconductor device 20P comprises the semiconductor chip 21, the resin package 22, detection mark bumps 51, connection bumps 52, and stud bumps 26. Since the semiconductor chip 21 is mounted in the semiconductor device 20P in the face-down fashion, the connection bumps 52 are formed on the lower surface (as in FIG. 25) of the semiconductor chip 21. The connection bumps 52 are solder bumps, for instance, and are formed on the electrode pads 28 (shown in FIG. 7) formed on the semiconductor chip 21. The detection mark bumps 51 are formed on the non-connection pads 29 on the semiconductor chip 21. The detection mark bumps 51 are also solder bumps. The bottom surfaces of the detection mark bumps 51 and the connection bumps 52 shown in FIG. 25 are exposed through the packaging surface 27 of the resin package 22.

The stud bumps 26 are formed only on the connection bumps 52. Accordingly, the detection mark bumps 51 remain exposed through the packaging surface 27 of the resin package 22. The exposed surfaces of the detection mark bumps 51 are leveled by a technique explained later, and are used as detection marks 30E in this embodiment.

Since the exposed surfaces of the detection mark bumps 51 are flat, the light reflectance is high at the detection marks 30E. When a position detecting process is carried out for the semiconductor device 20P, less light will scatter at the detection marks 30E, and a larger amount of light will be received by a CCD camera. Thus, the detection marks 30E can be accurately detected, and the reliability in the mounting of the semiconductor device 20P on a printed circuit board (not shown) can be improved.

Figure 26A:
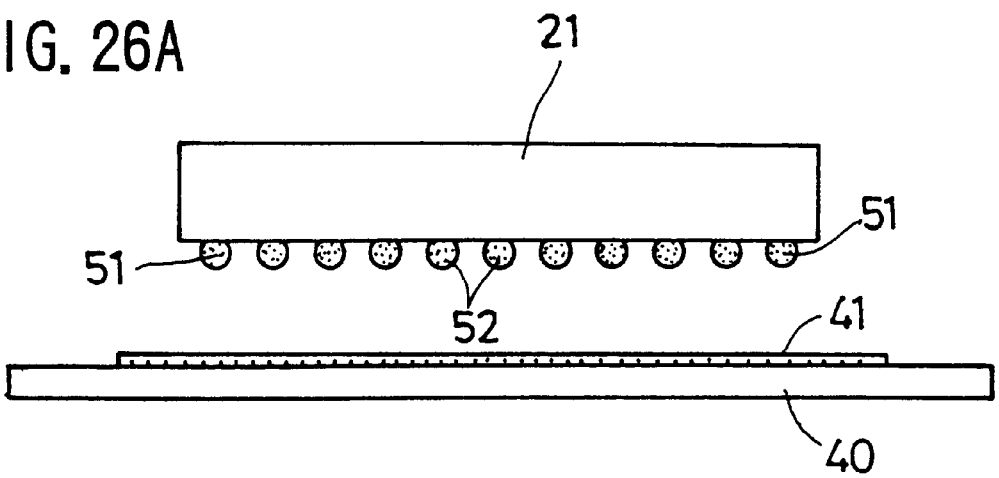
FIGS. 26A to 26C illustrate a method of producing the semiconductor device of the sixteenth embodiment of the present invention.
Figure 26B:
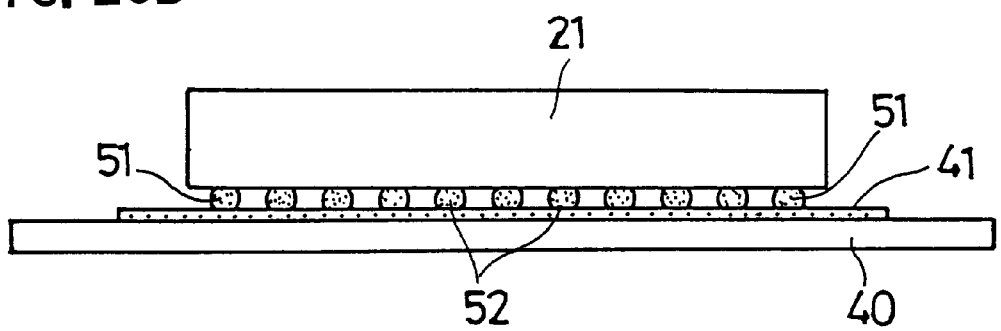
Figure 26C:
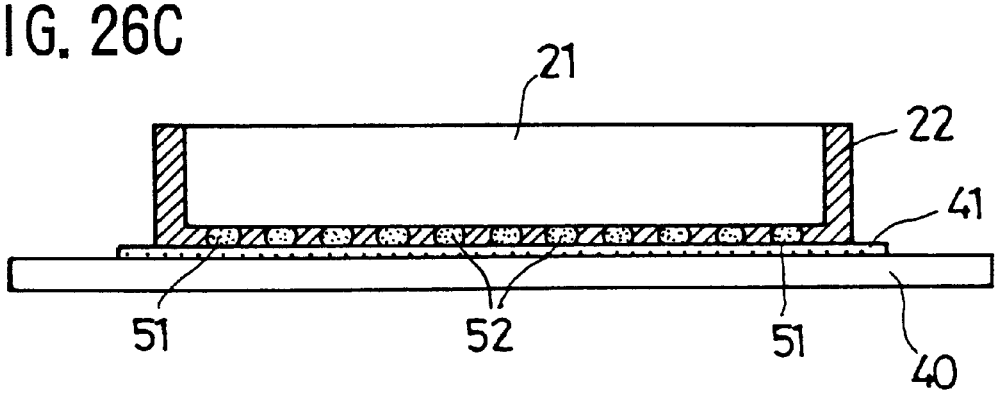

Referring now to FIGS. 26A to 26C, a method of producing the semiconductor device 20P having the detection marks 30E will be described.

First, the lead frame 40 having the metal plating film 41 formed thereon is prepared, as shown in FIG. 26A. The connection bumps 52 are then formed on the electrode pads 28 on the semiconductor chip 21, and the detection mark bumps 51 are formed on the non-connection pads 29. As explained before, the connection bumps 52 have the same structure as the detection mark bumps 51. Thus, all the bumps 51 and 52 can be collectively formed on the respective pads 28 and 29 by a transfer technique, for instance. This process will be hereinafter referred to as the bump forming step.

After the bump forming step, the semiconductor chip 21 having the bumps 51 and bumps 52 formed thereon is pressed against the lead frame 40, as shown in FIG. 26B. Here, the lead frame 40 has the same function as the leveling board 50 shown in FIG. 23. The bumps 51 and the bumps 52 are pressed so that their top ends become flat. This process is called a leveling step.

After the leveling step, the encapsulation step is carried out to form the resin package 22 for encapsulating the semiconductor chip 21, the detection mark bumps 51, and the connection bumps 52, as shown in FIG. 26C. The encapsulation step is followed by the melting step to remove the lead frame 40 and the metal plating film 41 from the resin package 22. As a result, the detection mark bumps 51 and the connection bumps 52 are exposed through the packaging surface 27 of the resin package 22. Also, because of the leveling step, the exposed surfaces of the detection mark bumps 51 and the connection bumps 52 are flat.

After the melting step, the stud bump forming step is carried out to form the stud bumps 26 as mounting terminals only on the exposed surfaces of the connection bumps 52. Accordingly, the detection mark bumps 51 remain exposed through the packaging surface 27 of the resin package 22, and form the detection marks 30E. The light reflectance is high at the detection marks 30E, because the exposed surfaces of the detection mark bumps 51 are flat. When a position detecting process is carried out for the semiconductor device 20P, less light will scatter at the detection marks 30E, and a larger amount of light will be received by a CCD camera. Thus, the detection marks 30E can be accurately detected, and the reliability in the mounting of the semiconductor device 20P on a printed circuit board (not shown) can be improved.

Figure 27:
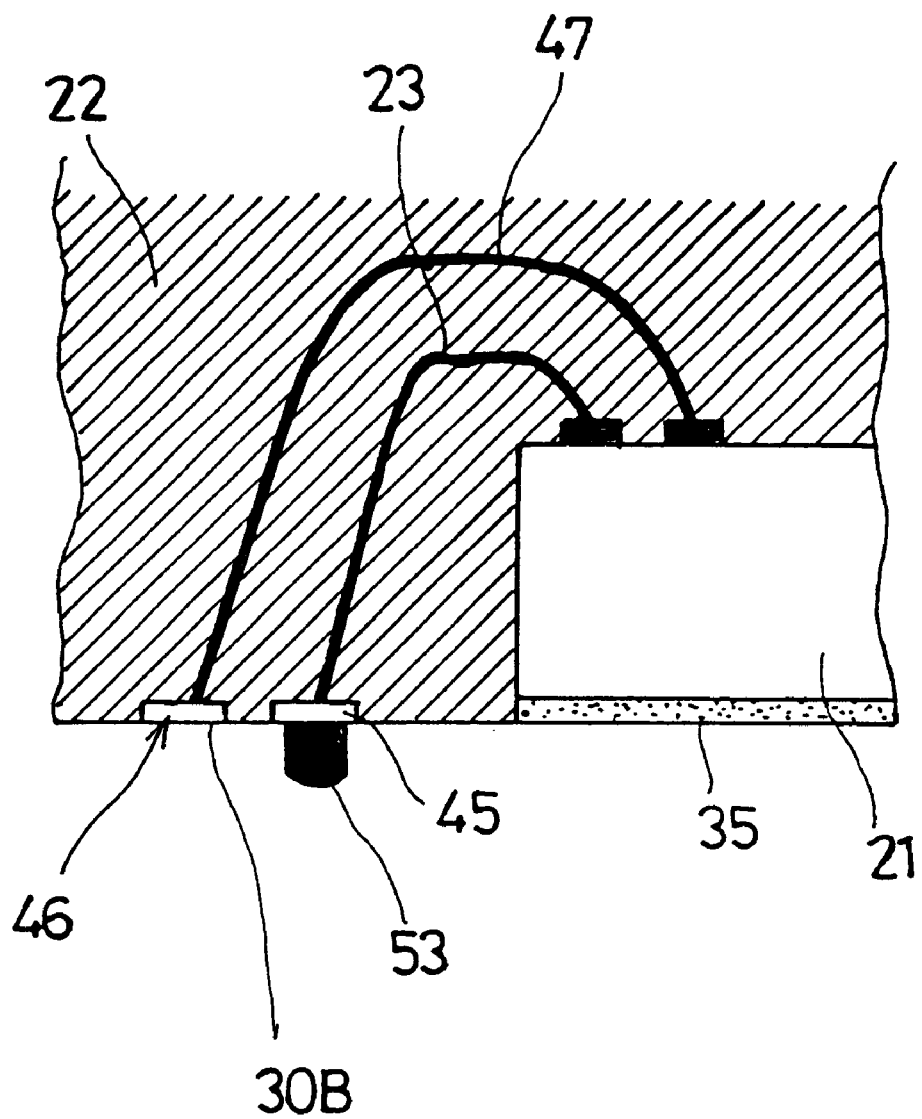
FIG. 27 is an enlarged sectional view of a wire arranged portion of a semiconductor device of a seventeenth embodiment of the present invention.

FIG. 27 is an enlarged view of a part of a semiconductor device 20Q which is a seventeenth embodiment of the present invention. In the embodiments explained so far, the stud bumps 26 are used as the mounting terminals. In this embodiment, on the other hand, pillar bumps 53 are employed as mounting terminals. The pillar bumps 53 are normally formed by a plating technique, and the top ends of the pillar bumps 53 have curved surfaces. Because of the curved surfaces, light scatters on the pillar bumps 53 like on the stud bumps 26, and the pillar bumps 53 cannot be used as detection marks. Therefore, it is necessary to apply one of the embodiments described previously to this embodiment.

Accordingly, as shown in FIG. 27, the detection mark metal films 46 exposed through the resin package 22 are used as the detection marks 30B, thereby improving the detection accuracy.

The present invention is not limited to the specifically disclosed embodiments, but variations and modifications may be made without departing from the scope of the present invention.

The present application is based on Japanese priority application No. 11-238907, filed on Aug. 25, 1999, the entire contents of which are hereby incorporated by reference.

What is claimed is:

1. A semiconductor device comprising:
   a semiconductor chip;
   a resin package which encapsulates the semiconductor chip;
   a plurality of mounting terminals formed on a bottom surface of the resin package facing a printed circuit board, the mounting terminals protruding from the bottom surface;
   a plurality of first wires which are connected to the semiconductor chip at one end and are directly connected to the mounting terminals at the other end; and
   a plurality of second wires which are exposed at one end through the resin package so as to form a flat surface with the bottom surface of the resin package.

2. The semiconductor device as claimed in claim 1, wherein the second wires at an opposite end to the exposed end are connected to a plurality of non-connection pads which have no electric connections and are formed on the semiconductor chip.

3. The semiconductor device as claimed in claim 1, wherein the second wires at an opposite end to the exposed end are terminated within the resin package.

4. A semiconductor device comprising:

a semiconductor chip;

a resin package which encapsulates the semiconductor chip;

a plurality of mounting terminals formed on a bottom surface of the resin package facing a printed circuit board, the mounting terminals protruding from the bottom surface of the resin package;

a plurality of wires which are connected to the semiconductor chip at one end, and are connected to the mounting terminals at the other end through a plurality of first metal films formed on the bottom surface of the resin package; and a plurality of second metal films which have exposed portions through the bottom surface of the resin package.

5. The semiconductor device as claimed in claim 4, wherein a plurality of reinforcing wires are connected to the second metal films at one end, and are connected to a plurality of non-connection pads at the other end, the non-connection pads being formed on the semiconductor chip and having no electrical connections.

6. The semiconductor device as claimed in claim 4, wherein a plurality of reinforcing wires are connected to the second metal films at one end, and are terminated within the resin package at the other end.

* * * * *